United States Patent
Konishi et al.

(10) Patent No.: US 10,167,566 B2
(45) Date of Patent: Jan. 1, 2019

(54) SUBSTRATE FOR LIGHT EMITTING DEVICE, LIGHT EMITTING DEVICE, AND METHOD FOR MANUFACTURING SUBSTRATE FOR LIGHT EMITTING DEVICE

(71) Applicant: Sharp Kabushiki Kaisha, Osaka-shi, Osaka (JP)

(72) Inventors: Masahiro Konishi, Osaka (JP); Shin Itoh, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 40 days.

(21) Appl. No.: 14/912,195

(22) PCT Filed: Jul. 25, 2014

(86) PCT No.: PCT/JP2014/069745
§ 371 (c)(1),
(2) Date: Feb. 16, 2016

(87) PCT Pub. No.: WO2015/033700
PCT Pub. Date: Mar. 12, 2015

(65) Prior Publication Data
US 2016/0204320 A1    Jul. 14, 2016

(30) Foreign Application Priority Data
Sep. 5, 2013  (JP) .................................. 2013-184362

(51) Int. Cl.
*H01L 33/60*    (2010.01)
*C25D 11/04*    (2006.01)
(Continued)

(52) U.S. Cl.
CPC ............ *C25D 11/04* (2013.01); *H01L 33/005* (2013.01); *H01L 33/641* (2013.01); *H01L 33/60* (2013.01);
(Continued)

(58) Field of Classification Search
None
See application file for complete search history.

(56) References Cited

U.S. PATENT DOCUMENTS 5,159,433 A * 10/1992 Kazami ............. H01L 21/67121
                                                        257/681
5,625,222 A *  4/1997 Yoneda ................... H01L 23/24
                                                        257/687
(Continued)

FOREIGN PATENT DOCUMENTS

CN        101051665 B       12/2010
JP        59-149958 A        8/1984
(Continued)

OTHER PUBLICATIONS

Official Communication issued in International Patent Application No. PCT/JP2014/069745, dated Nov. 4, 2014.

*Primary Examiner* — Fazli Erdem
*Assistant Examiner* — Scott R Wilson
(74) *Attorney, Agent, or Firm* — Keating & Bennett, LLP

(57) ABSTRACT

A substrate (5) in which a surface of an aluminum base (10) other than a surface on which an insulating thin film layer (17) is formed is covered with a protective layer (19) which is an aluminum anodic oxide film.

13 Claims, 13 Drawing Sheets

(51) Int. Cl.
 *H01L 33/00* (2010.01)
 *H01L 33/64* (2010.01)
(52) U.S. Cl.
 CPC ............... *H01L 2224/48137* (2013.01); *H01L 2933/0058* (2013.01); *H01L 2933/0075* (2013.01)

(56) References Cited

U.S. PATENT DOCUMENTS

| | | | |
|---|---|---|---|
| 2007/0228947 A1* | 10/2007 | Tanimoto | F21K 9/00 |
| | | | 313/506 |
| 2007/0235743 A1 | 10/2007 | Lee et al. | |
| 2009/0078455 A1 | 3/2009 | Takakusaki et al. | |
| 2009/0267505 A1 | 10/2009 | Lee et al. | |
| 2012/0091495 A1 | 4/2012 | Hatanaka et al. | |
| 2012/0113650 A1 | 5/2012 | Inoue | |
| 2014/0084452 A1* | 3/2014 | Nagamatsu | H05K 1/053 |
| | | | 257/734 |
| 2014/0284651 A1* | 9/2014 | Tsuchiya | H01L 33/641 |
| | | | 257/99 |
| 2015/0084080 A1* | 3/2015 | Kawakita | H01L 25/167 |
| | | | 257/98 |

FOREIGN PATENT DOCUMENTS

| | | |
|---|---|---|
| JP | 2009-081196 A | 4/2009 |
| JP | 2009-267322 A | 11/2009 |
| JP | 4389840 B2 | 12/2009 |
| JP | 2011-171379 A | 9/2011 |
| JP | 2011-233395 A | 11/2011 |
| JP | 2012-069749 A | 4/2012 |
| JP | 2012-102007 A | 5/2012 |
| WO | 2010/150810 A1 | 12/2010 |

* cited by examiner

ELECTRODE PATTERN FORMING PROCESS

4A:LIGHT EMITTING DEVICE
5B:SUBSTRATE
6:LED LIGHT EMITTING ELEMENT
7:SEALING RESIN
8:SEALING RESIN CIRCUMFERENTIAL EDGE FRAME BODY
10:ALUMINUM BASE
20A:ELECTRODE PATTERN
37:ANODE ELECTRODE
38:CATHODE ELECTRODE
39:ANODE MARK
40:CATHODE MARK

5B: SUBSTRATE
6: LED LIGHT EMITTING ELEMENT
10: ALUMINUM BASE
17a: LOWER THIN FILM LAYER
17b: UPPER THIN FILM LAYER
19: PROTECTION LAYER
20A: ELECTRODE PATTERN

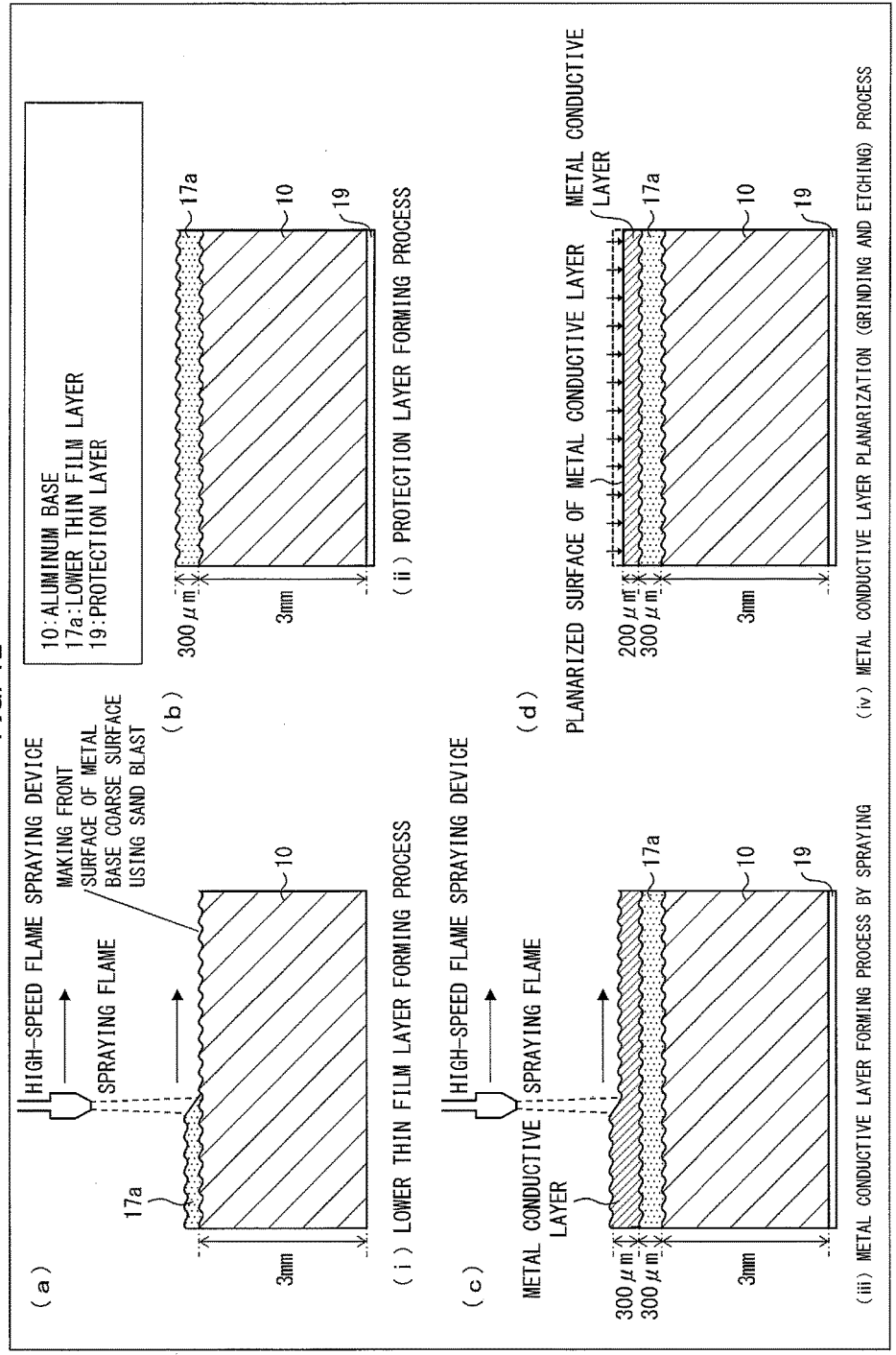

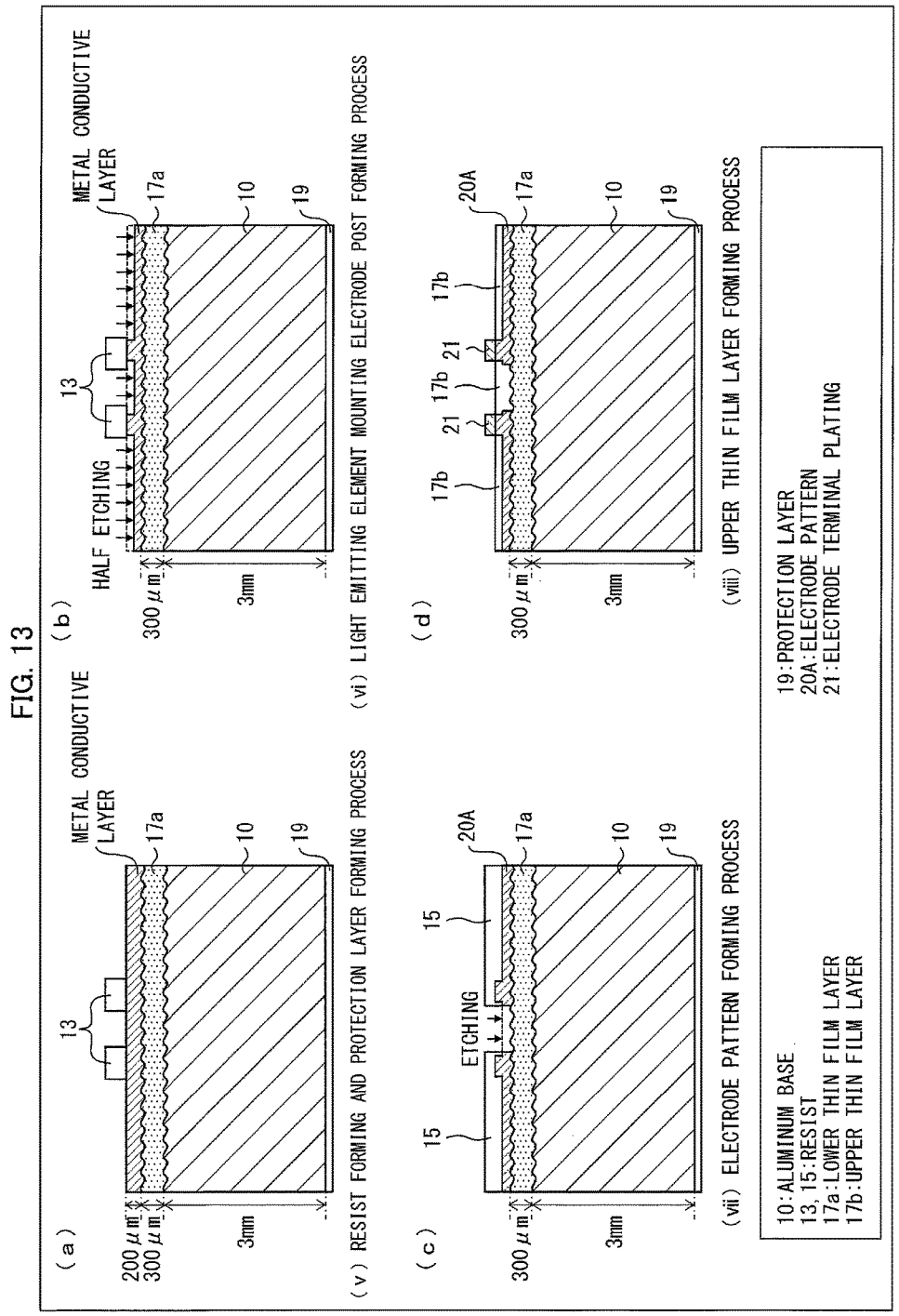

SUBSTRATE FOR LIGHT EMITTING DEVICE, LIGHT EMITTING DEVICE, AND METHOD FOR MANUFACTURING SUBSTRATE FOR LIGHT EMITTING DEVICE

TECHNICAL FIELD

The present invention relates to a substrate for a light emitting device which realizes high heat dissipation and has a structure for protection from plating solution in a plating process of an electrode pattern, a light emitting device which uses the substrate, and a method for manufacturing the substrate.

BACKGROUND ART

Examples of basic necessary functions as a substrate for a light emitting device include high reflectivity, high heat dissipation, and long-term reliability. A representative example of a substrate having these functions is a ceramic substrate, and the ceramic substrate is manufactured by forming an electrode pattern on a plate-shaped ceramic substrate.

However, according to a trend of high power of the light emitting device, as a result of pursuing improvement of brightness by aligning multiple light emitting elements on a substrate, the size of the ceramic substrate has been increased over the years. Specifically, when a general LED light emitting device which is used at 30 W of supplying power is realized by aligning blue LED elements which are classified as medium-sized and have a dimension of approximately 500 μm×800 μm or greater or less, approximately 100 LED elements are necessary. An example of the ceramic substrate, in which approximately 100 LED elements are aligned, includes a substrate having a plane size of 20 mm×20 mm or greater and a thickness of approximately 1 mm.

When realizing an LED light emitting device which is used at 100 W or higher of supplied power, reverting to a technical invention based on an increased size of the substrate, a large ceramic substrate which can have 400 or more LED elements loaded thereon, and has a plane size of at least 40 mm×40 mm, is necessary. However, it is difficult to realize such a large ceramic substrate on a commercial base, because of three problems, which are decreased strength of a substrate, decreased manufacturing accuracy, and increased manufacturing costs, as follows.

First, since a ceramic is a basic baked material, a problem is generated in which strength is decreased when increasing the size. When increasing the thickness of the substrate to overcome this problem, both the thermal resistance and the weight increases at the same time, and material costs of the substrate also increase. In addition, when increasing the size of the ceramic substrate, not only an external dimension, but also a dimension of an electrode pattern formed on a substrate becomes easy to be deviated. As a result, this easily leads to deterioration of a manufacturing yield and an increase in manufacturing costs.

Here, in order to overcome the above-described problems of increasing the size of the ceramic substrate, for example, as described in PTL 1 to PTL 4, a substrate in which a ceramic layer, which serves as a reflecting layer, is formed on a metal base is developed. In this manner, the substrate in which the ceramic layer is formed on the metal base has high reflectivity, high heat dissipation, long-term reliability, sufficient strength, and manufacturing accuracy.

CITATION LIST

Patent Literature

PTL 1: Japanese Unexamined Patent Application Publication No. 59-149958 (Aug. 28, 1984)
PTL 2: Japanese Unexamined Patent Application Publication No. 2012-102007 (May 31, 2012)
PTL 3: Japanese Unexamined Patent Application Publication No. 2012-69749 (Apr. 5, 2012)
PTL 4: Japanese Patent No. 4389840 (Oct. 16, 2009)

SUMMARY OF INVENTION

Technical Problem

However, in a structure and a method for manufacturing the substrate in the related art in which the ceramic layer is formed on the metal base, new problems are generated.

The substrate in the related art has a structure in which a light emitting element mounting surface of a metal base is covered with a ceramic layer, and a surface (rear surface) which is a metal surface on a side opposite to the light emitting element mounting surface is exposed for securing heat dissipation. In this structure, for example, by making the metal surface of the base rear surface tightly adhere to a heat sink via heat dissipating grease, it is possible to realize high heat dissipation.

On the ceramic layer of the light emitting element mounting surface, in order to obtain an electric connection with the light emitting element an electrode pattern is formed. In a manufacturing process of the electrode pattern, first, as an underlayer of the electrode pattern, a circuit pattern is drawn by printing or the like by using a metal paste made of a resin containing metal particles, the circuit pattern is dried, and an underlying circuit pattern is prepared. Next, a resin-covered layer, which covers a front surface of the underlying circuit pattern, is removed by etching, and a conductive layer is exposed. Finally, by plating treatment, electrode metal is deposited on the underlying circuit pattern, and the electrode pattern is completed.

A first priority in the manufacturing process of the substrate in the related art is the plating treatment of forming the electrode pattern. In order to protect the metal base from plating solution, which is used in the plating treatment, it is necessary to cover the base metal surface with a protection sheet as a pre-treatment process, or it is necessary to peel the protection sheet for ensuring heat dissipation of the substrate as a post-treatment process. If the plating treatment is performed in a state where the process of covering with the protection sheet is omitted, and the metal surface of the metal base rear surface is exposed, not only the plating solution infiltrates to the metal base rear surface, but also a noble metal, such as Au, which is the same as the electrode pattern is deposited and covers the surface. In other words, in addition to erosion of the base, a larger part of the noble metal in the plating solution is deposited not to the electrode pattern, but to a part which is not necessary on the base rear surface, and thus, a large amount of loss is generated in the noble metal. For this reason, a series of processes of carefully pasting and peeling the protection sheet so the plating solution does not leak takes time and cannot be omitted, and this causes a hindrance to performing mass production of the substrate for a light emitting device.

A solution that can be simply found, to the above-described problems is introducing a device which automatically performs attaching and detaching work of a protection sheet. However, there is no such general-purpose automated device, and in general, the automated device is an unrealistic choice for manufacturing the substrate for a light emitting device which should be made inexpensively. Next, a solution which can be considered, is using a special protection sheet. In other words, if a protection sheet is an insulation film in which erosion is not generated by the plating solution due to chemical resistance, and the plating solution is not deposited, and additionally, high conductivity and long-term reliability can be ensured, it is not necessary to peel the sheet after the plating treatment, if the sheet is at least pasted to the base. Even when such a protection sheet is continually used as a part of the substrate, high heat dissipation and long-term reliability, which are basic functions of the substrate, are not damaged. However, in a flexible protection sheet having chemical resistance made of an organic compound, there is not a protection sheet which can ensure a high level of a thermal conductivity which is necessary for a high-power LED light emitting device and long-term reliability at a high temperature, and can react to mass production.

In consideration of the above-described problems, an object of the present invention is to provide a substrate which has a function of protecting a base, and which is excellent in mass productivity without deterioration of a function required as a light emitting device, a method for manufacturing the substrate, and a light emitting device provided with the substrate.

Solution to Problem

In order to solve the above-described problems, according to an aspect of the present invention, there is provided a substrate for a light emitting device in which an insulating reflecting layer which reflects light from a light emitting element is formed on a base made of aluminum, and in which a surface of the base other than a surface on which the reflecting layer is formed is covered with an aluminum anodic oxide film.

Here, an insulating thermally conductive layer having a higher thermal conductivity than that of the reflecting layer may be interposed between the base and the reflecting layer.

Advantageous Effects of Invention

According to the above-described configuration, the surface of the base formed of aluminum other than the surface on which the reflecting layer is formed is covered with the aluminum anodic oxide film. For this reason, it is possible to protect the base from the plating solution or the like in the manufacturing process of the substrate by the aluminum anodic oxide film. Furthermore, because the above-described coating film does not impair the important functions of the light emitting device, that is, high heat dissipation and long-term reliability, it is not necessary to peel the above-described coating film from the substrate. Accordingly, by allowing the coating film to remain, it is possible to protect the substrate or the device after manufacturing. In other words, the above-described coating film can be used as both a process protection film and a device protection film. In addition, since it is possible to form the coating film by performing anodic oxidation treatment, mass productivity becomes excellent.

As described above, according to the above-described configuration, it is possible to provide a substrate for a light emitting device which has a function of protecting the base, and is excellent in mass productivity without deterioration of the functions required as a light emitting device.

BRIEF DESCRIPTION OF DRAWINGS

FIGS. 12(a) to 12(d) are views illustrating a manufacturing process of the substrate of the above-described Modification Example 2.

FIGS. 13(a) to 13(d) are views illustrating the following manufacturing process of the substrate of the above-described Modification Example 2.

DESCRIPTION OF EMBODIMENTS

Embodiment 1

Hereinafter, one embodiment of the present invention will be described with reference to the drawings.

(Structure of Substrate)

Figure 1:
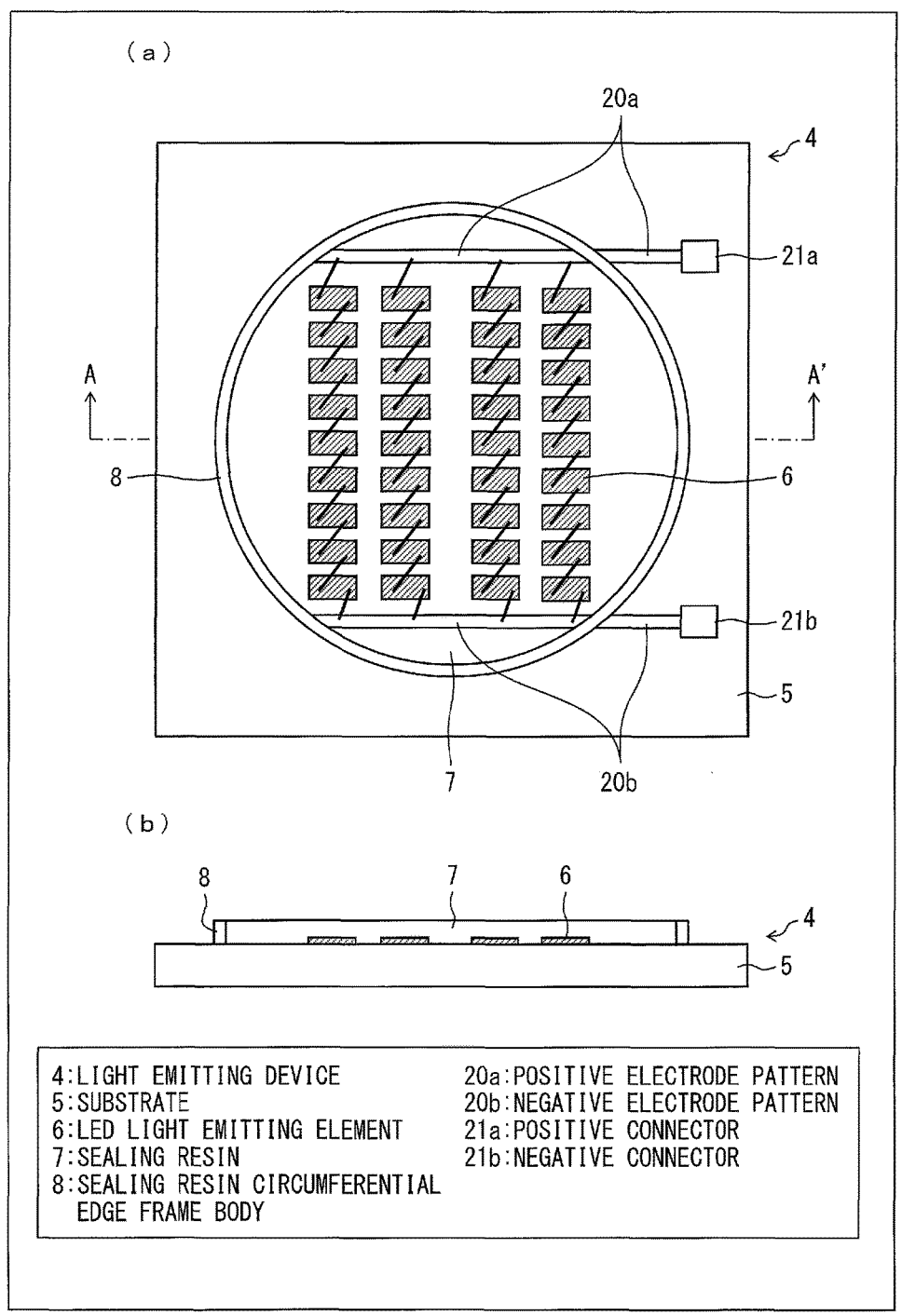
FIG. 1(a) is a plan view of a light emitting device of one embodiment of the present invention.
FIG. 1(b) is a sectional view thereof.

FIGS. 2(a) and 2(b) are a plan view and a sectional view of a substrate (substrate for a light emitting device) 5 of the embodiment. FIG. 2(c) is an enlarged view of the sectional view of the substrate 5. The substrate 5 is a substrate on which light emitting elements are disposed, and which is used in a light emitting device. An example of the light emitting device is illustrated in FIG. 1. In any drawings, the dimensions, the shapes, and the numbers are not necessarily the same as those of a practical substrate, light emitting elements, and a light emitting device. The light emitting device which uses the substrate 5 will be described by Embodiment 3.

Figure 2:
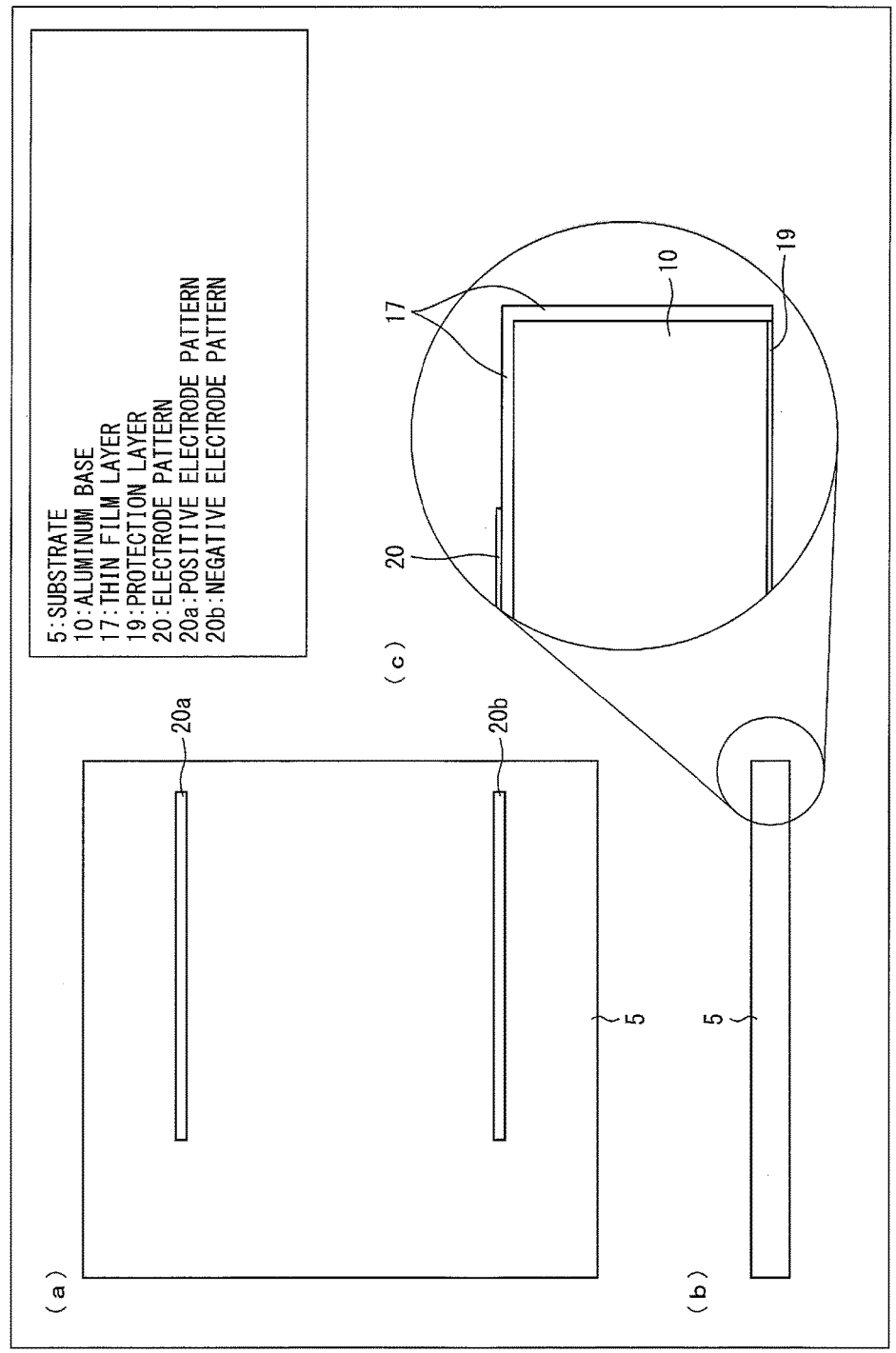
FIG. 2(a) is a plan view of a substrate of one embodiment of the present invention.
FIG. 2(b) is a sectional view thereof.
FIG. 2(c) is an enlarged view of the sectional view.
Figure 7:
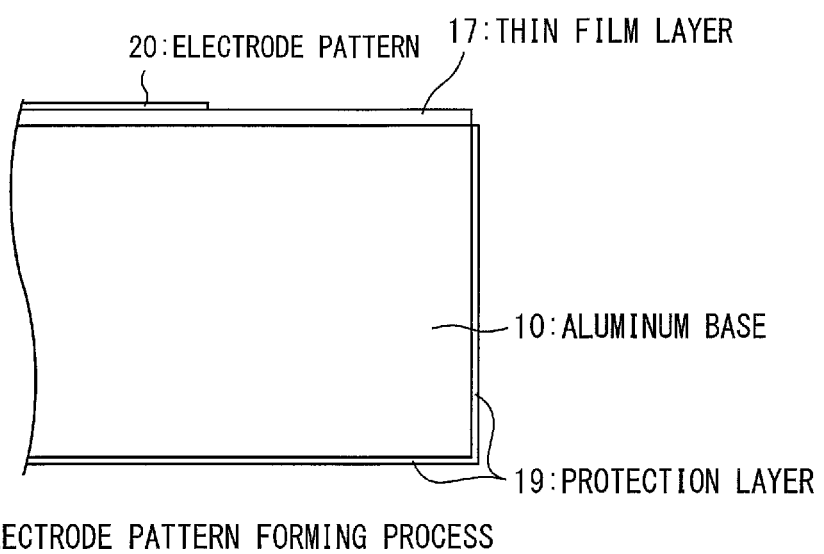
FIG. 7 is a schematic view of a modification example of the substrate of one embodiment of the present invention.

As illustrated in FIG. 2(c), in the substrate 5, a thin film layer (reflecting layer) 17 and an electrode pattern 20 are formed on an aluminum base (base) 10. In addition, on a surface of the aluminum base 10 other than a surface on which the thin film layer 17 is formed, a protective layer (an aluminum anodic oxide film) 19 is formed. In other words, an upper surface of the aluminum base 10 is covered with the thin film layer 17, and a rear surface (a surface opposing the surface on which the thin film layer 17 is formed) of the aluminum base 10 is covered with the protective layer 19. In addition, in FIG. 2, a side surface of the aluminum base 10 is covered with the thin film layer 17, but instead, as illustrated in FIG. 7, the side surface of the aluminum base 10 may be covered with the protective layer 19. Furthermore, the electrode pattern 20 is formed on the thin film layer 17. The electrode pattern 20 is formed of an underlying circuit pattern (not illustrated) made of a conductive layer, and plating (not illustrated) which covers the circuit pattern. The electrode pattern 20 is wiring for obtaining electric connection with the light emitting element disposed on the substrate 5.

As the aluminum base 10, it is possible to use an aluminum plate which has a length of 50 mm, a width of 50 mm, and a thickness of 3 mm, for example. Advantages of aluminum are light-weight properties, excellent workability, and high thermal conductivity. The aluminum base 10 may include components in addition to aluminum which have a degree of not hindering anodic oxidation treatment which will be described later.

The thin film layer 17 is made of an insulating material which reflects light from the light emitting element. In the embodiment, the thin film layer 17 is formed of a thin film including a ceramic. The thin film layer 17 may be formed of a mixture of a ceramic and glass, a mixture of a ceramic and a resin, or a ceramic. Since the ceramic has high electrostatic withstand voltage characteristics, it is possible to prevent a short circuit between the aluminum base 10 and the electrode pattern 20. In consideration of reflectivity of the substrate 5, the film thickness of the thin film layer 17 may be approximately from 50 μm to 500 μm. When considering thermal resistance, it is desirable that the film thickness is approximately from 50 μm to 150 μm. In addition, since a crack is likely to be generated on the thin film layer 17 when the film thickness of the thin film layer 17 exceeds 1 mm, it is possible for the film thickness to be equal to or less than 1 mm.

The protective layer 19 is an aluminum anodic oxide film (alumite). Advantages of alumite are as follows. Alumite can be easily formed by the anodic oxidation treatment on a front surface of aluminum. A thermal conductivity of alumite is lower than that of metal having a relatively high thermal conductivity (several tens of W/(m·K)), but is higher than that of glass or a resin. Alumite has chemical resistance, and is stable at high temperatures and at high humidity. In addition, even when the thickness of the layer is thin (from several μm to several tens of μm), alumite functions as a protective layer.

The protective layer 19 is introduced to protect the base from the plating solution when performing the plating treatment of forming the electrode pattern 20 as will be described later, and aims at functioning as a layer for preventing erosion by oxidation of the aluminum base 10. For this reason, after finishing the plating treatment process of forming the electrode pattern 20, the protective layer 19 remains on a base rear surface, since it is not removed, and when the substrate 5 is used in the light emitting device, it is possible to prevent erosion of the aluminum base 10 and deterioration of the substrate.

(Method for Manufacturing Substrate)

Figure 3:
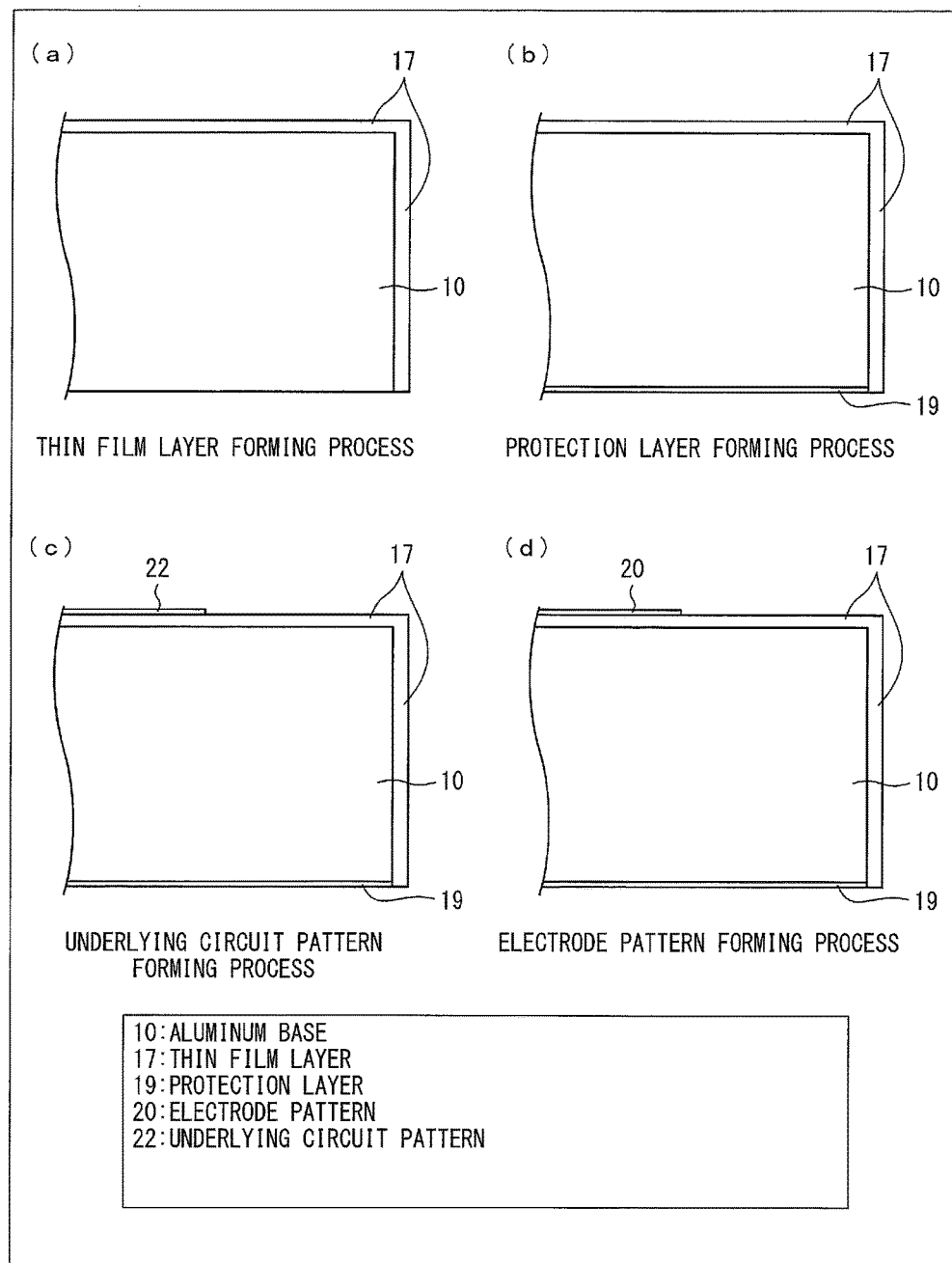
FIGS. 3(a) to 3(d) are views illustrating a manufacturing process of a substrate of one embodiment of the present invention.

Next, a method for manufacturing the substrate 5 of the embodiment will be described in order by using FIG. 3.

First, the aluminum base 10 (for example, a length of 50 mm, a width of 50 mm) is cut from an aluminum plate (for example, 3 mmt), the thin film layer 17 is formed on an upper surface and a side surface of the aluminum base 10 as illustrated in FIG. 3(a) (thin film layer forming process, reflecting layer forming process), and the protective layer 19 is formed on the base rear surface as illustrated in FIG. 3(b) (protective layer forming process, coating film forming process). In addition, on the side surface of the aluminum base 10, the protective layer 19 may be formed instead of the thin film layer 17. In the anodic oxidation treatment of a process of forming the protective layer 19, which will be described later, a part where the aluminum base 10 is exposed, except a part covered with the thin film layer 17, becomes the protective layer 19.

In order to form the thin film layer 17, after coating the aluminum base 10 with a raw material, firing may be performed. Here, it is desirable that glass is synthesized by a sol-gel method from a glass raw material, and the thin film layer 17 is formed, after coating the aluminum base 10 with a ceramic coating material containing ceramic particles fired at a high temperature and a glass raw material, as a raw material of the thin film layer 17. Accordingly, as the type of layer, it is possible to form a glass binder at a relatively low temperature of 250° C. to 400° C.

A temperature for firing a ceramic raw material is generally a high temperature of 1200° C. to 1400° C. In addition, even in a case where the ceramic coating material in which the general glass binder containing the ceramic particles is fired at a high temperature, the firing temperature of glass becomes approximately 900° C., which is a substantially high temperature. Since the melting point of aluminum is approximately 660° C., the material cannot endure such a high temperature process, and thus, a method of synthesizing glass by the sol-gel method from the glass raw material is employed. In this method, when the firing temperature is 250° C. to 400° C., it is possible to realize a process temperature lower than the melting point of aluminum or approximately 660° C., and thus, aluminum can be used as the base, for the first time.

Since the glass component which is used as a binder also has heat resistance, light resistance, and electrostatic withstand voltage characteristics similar to a ceramic, the glass component is desirable as a reflecting material for an illumination device. In particular, in a case where a light source is used in which the supplied power is from 10 W to 100 W or exceeds the range, since heating or light generating of the light source generates severe conditions, a stable material, such as glass, is desirable.

In addition, in the thin film layer forming process, after coating the aluminum base 10 with a thermosetting resin containing the ceramic particles, the thin film layer 17 may be formed by drying and hardening. Since the thermosetting resin prevents heating of the light source, temporal deterioration when receiving strong light radiation by blue light or the like, or generation of discoloration, a resin having high heat resistance and high light resistance is used. In addition, a resin which also has resistance to acid used in the plating treatment solution or the anodic oxidation treatment is used. Here, the thermosetting resin is described as an example, but is not limited to the thermosetting resin, and for example, a thermoplastic resin may be used. Specific examples of the material include a silicone resin, an epoxy resin, a polyimide resin, and a fluorine resin.

In addition, examples of a representative material which is used as the ceramic or the ceramic particles, include alumina, zirconia, titanium oxide, or aluminum nitride. The ceramic referred here is not limited to metal oxide, and an example thereof includes a ceramic in a wide sense including aluminum nitride, that is, a general inorganic solid material. Among the inorganic solid materials, an arbitrary material may be employed if the material is stable and excellent in heat resistance and light resistance, and has excellent light diffusion and light reflection, similar to alumina, zirconia, titanium oxide, and aluminum oxide. In addition to this, examples of a ceramic material having high light reflection include magnesium oxide, zinc oxide, barium sulfate, zinc sulfate, magnesium carbonate, calcium carbonate, and wollastonite, which are representative inorganic white materials. Particles made of the above-described ceramic material may be used by being appropriately selected and combined.

Long-term reliability of the thin film layer 17 adhered by the thermosetting resin on the aluminum base 10 deteriorates compared to that of the thin film layer 17 adhered by the glass binder, but it is possible to easily form the thin film layer 17 at a relatively low temperature which is equal to or less than 200° C. Accordingly, it is possible to prevent damage by the heat with respect to the aluminum base, and to reduce the manufacturing costs.

In addition, when the thermosetting resin is used in forming the thin film layer 17, a degree of freedom of an order of process also increases since the process temperature is low. In other words, in this manner, in a case where the thin film layer forming process is performed at a relatively low temperature which is equal to or less than 200° C., it is not necessary to take into consideration a problem of generation of a crack on the protective layer, because either a protective layer forming process or the thin film layer forming process may be performed, regardless of order. Accordingly, it is possible to employ a substrate for a light emitting device in which the thin film layer 17 adhered by the thermosetting resin is formed, in accordance with a purpose or a use.

The protective layer 19 is formed by the anodic oxidation treatment of aluminum (alumite treatment). In the embodiment, since the aluminum base 10 is used, by performing the alumite treatment with respect to the rear surface thereof, it is possible to form the protective layer 19. Accordingly, it is possible to form the protective layer 19 made of the aluminum anodic oxide film which is extremely hard and has excellent durability.

A thermal conductivity of alumite is substantially 67 W/(m·K). Compared to a thermal conductivity of aluminum which is 236 W/(m·K), the thermal conductivity of alumite is merely approximately ⅓. However, compared to a thermal conductivity of glass which is approximately 1 W/(m·K) and a thermal conductivity of a silicone resin which is from 0.15 W/(m·K) to 0.30 W/(m·K), alumite has an overwhelmingly high thermal conductivity. Furthermore, the thickness of the alumite film which is generally used is approximately from 5 μm to 10 μm, and even in a case where the thickness is thick, the thickness is approximately 30 μm.

Here, as presumed, when estimating a value of heat resistance in a case where a glass layer having a thickness of 100 μm is formed on a front surface of the aluminum base 10 having a length of 50 mm, a width of 50 mm, and a thickness of 3 mm, and an alumite film having a thickness of 30 μm that is formed on a rear surface, the heat resistance in a thickness direction of the base decreases digit by digit in an order of the glass layer, the aluminum base, and the alumite film, to be respectively 0.04 K/W, 0.0051 K/W, and 0.00018 K/W. The heat is uniformly generated on the substrate, and in a case where the entire amount of heat generated is 100 W, the temperature of each layer increases in order, to be 4° C., 0.51° C., and 0.02° C. According to this, even in a case where the influence of the alumite film is estimated to be the highest, compared to the other two layers, the influence is small, and thus, the influence of the heat resistance and the increase in the temperature can be ignored.

Here, an influence which can be generated by the protective layer 19 formed by the alumite treatment is an increase in heat resistance, but as considered above, the influence is extremely small and can sufficiently be ignored, compared to the heat resistance generated in other layers. Accordingly, since the rear surface of the aluminum base 10 is also covered with the protective layer 19 made of alumite, which is extremely hard and has excellent durability, by the alumite treatment, a positive influence increases, such as improvement of reliability of the substrate.

In a practical manufacturing, sealing treatment is performed after the alumite treatment, and a porous hole which is generated on the aluminum anodic oxide film which is the protective layer 19 is blocked. In this manner, if the sealing treatment is performed after the alumite treatment, the aluminum anodic oxide film, which is the protective layer 19, is stabilized, and durability and corrosion resistance of the aluminum base 10 become more reliable. The sealing treatment may be performed according to a general method in the field, and as a representative method, sealing treatment in boiling water is employed. In other words, after forming the anodic oxide film, the film is sufficiently cleaned by water, and is kept for approximately 30 minutes in heated pure water. By this method, workability is high, since it is possible to perform the treatment with respect to multiple substrates 5 at the same time.

In addition, it is desirable that the protective layer forming process by the alumite treatment is performed after the thin film layer forming process. As described above, in the thin film layer forming process, after coating the aluminum base 10 with a ceramic coating material containing ceramic particles fired at a high temperature and the glass raw material, the thin film layer 17 is formed by synthesizing the glass by the sol-gel method from the glass raw material. The firing temperature at this time is lower than the melting point of aluminum, which is approximately 660° C., and is from 250° C. to 400° C.

When performing the firing the protective layer 19 by increasing the temperature to the range, a crack (fracture) is generated in the protective layer 19, and only a function of protecting the base from the plating solution when performing the plating treatment of forming the electrode pattern substantially deteriorates, or similarly, a function as the protective film of the substrate for a light emitting device also deteriorates. In addition, by performing the thin film layer forming process in advance, the thin film layer 17 containing a ceramic achieves a role of a mask with respect to the alumite treatment in the protective layer forming process. Accordingly, only a part where an aluminum-based material is exposed other than the thin film layer 17 on the aluminum base 10 is covered with the protective layer 19.

In addition, another reason why it is desirable that the protective layer forming process by the alumite treatment is performed after the thin film layer forming process is that it is difficult to form the thin film layer 17 on the alumite and the layer becomes peeled. In a case where the thin film layer forming process is performed after the protective layer forming process, the only way to avoid the difficulty described above is partially performing alumite treatment with respect to the aluminum base 10 in the protective layer forming process, or removing of the anodic oxide film in a region where the thin film layer 17 is formed after the alumite treatment with respect to the entire aluminum base 10 in the protective layer forming process. All of the treatments are difficult to perform, and in reality, the number of unnecessary processes increases and the manufacturing becomes complicated. For this reason, in order to simplify the manufacturing process by reducing labor, it is desirable to perform the protective layer forming process after the thin film layer forming process.

By the above-described processes, the substrate 5 in which the aluminum base 10 is covered with the thin film layer 17 and the protective layer 19 is manufactured. Furthermore, the electrode pattern 20 is formed on the thin film layer 17 as follows.

First, as illustrated in FIG. 3(c), a metal paste, which is made of a resin containing metal particles, is used as an underlayer of the electrode pattern 20, the circuit pattern is drawn by printing or the like, and is dried, and the underlying circuit pattern 22 is formed (underlying circuit pattern forming process, conductive layer forming process). Since the front surface of the underlying circuit pattern 22 is thinly covered with a resin-coated layer containing the metal paste, while maintaining this state, plating is not deposited. For this reason, the resin-coated layer is removed by etching, the conductive layer of the underlying circuit pattern 22 is exposed, and as illustrated in FIG. 3(d), electrode metal is deposited on the underlying circuit pattern by the plating treatment, and the electrode pattern 20 is formed (electrode pattern forming process).

The aluminum base 10 is generally covered with the thin film layer 17 which has high reflectivity and contains a ceramic, and the protective layer 19 of the anodic oxide film. For this reason, by the plating solution which is used in the plating treatment in the electrode pattern forming process, the aluminum base 10 is not eroded, and it is possible to effectively deposit the electrode metal from the plating solution only on the underlying circuit pattern.

Since the protective layer 19 is an aluminum anodic oxide film, the heat resistance is extremely low and can be ignored. For this reason, after the plating treatment is finished, it is also not necessary to peel the layer in order to protect heat dissipation of the substrate, and it is also possible to omit a peeling process which is necessary for the protection sheet. In contrast, it is desirable that the protective layer 19 remains for giving the aluminum base 10 durability and corrosion resistance.

As can be ascertained from above, the substrate 5 has a function of protecting the aluminum base 10. In addition, the substrate 5 does not degrade the functions which are required for the light emitting device, and is excellent in the mass productivity.

Modification Example 1

The thin film layer 17 which is a reflecting layer may be configured of a two-layered structure. Here, in the following description, a substrate (substrate for a light emitting device) 5A which has the two-layered structure in which the thin film layer 17 is configured of a lower layer (lower thin film layer 17a) and an upper layer (upper thin film layer 17b) will be described as Modification Example 1 of Embodiment 1 with reference to FIGS. 8 and 9. In addition, configuration elements having the same functions as those of the configuration elements described above will be given the same reference numerals, and the description thereof will not be repeated.

Figure 8:
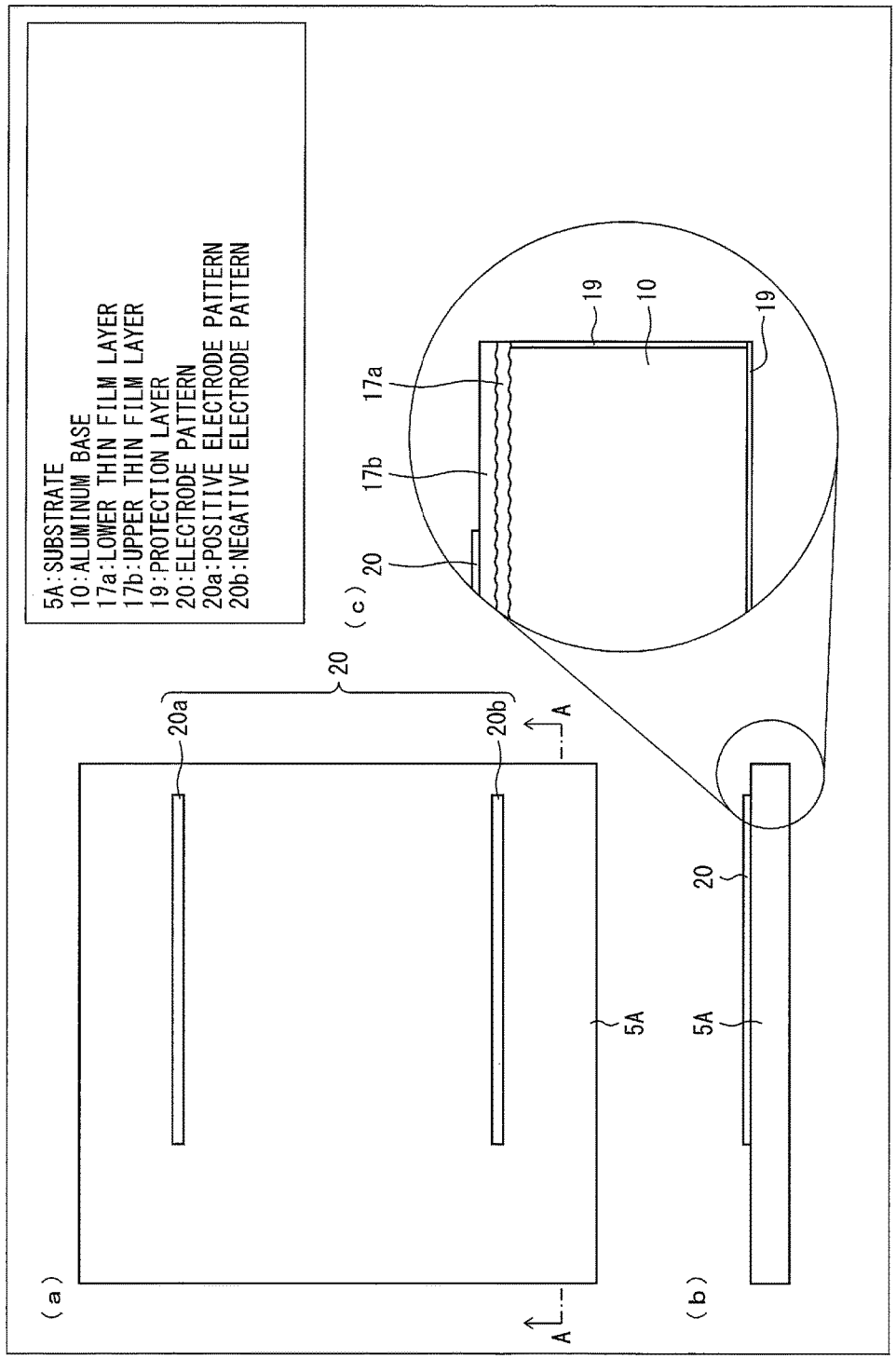
FIG. 8 is a schematic view of a substrate of Modification Example 1 of one embodiment of the present invention.

As illustrated in FIG. 8, in the substrate 5A of Modification Example 1, the lower thin film layer 17a, the upper thin film layer 17b, and the electrode pattern 20 are formed in this order on the aluminum base 10. In addition, the protective layer 19 is formed on the rear surface and the side surface of the aluminum base 10.

The lower thin film layer 17a is formed of a material having a higher heat conductivity than that of the upper thin film layer 17b, the upper thin film layer 17b is formed of a material having a higher reflectivity than that of the lower thin film layer 17a. By making the lower thin film layer 17a an insulating layer (thermally conductive layer) having a higher heat conductivity than that of the upper thin film layer 17b, and by making the upper thin film layer 17b an insulating layer (reflecting layer) having higher reflectivity than that of the lower thin film layer 17a, it is possible to realize a substrate having high reflectivity, more excellent heat conductivity and excellent electrical insulating properties.

Figure 9:
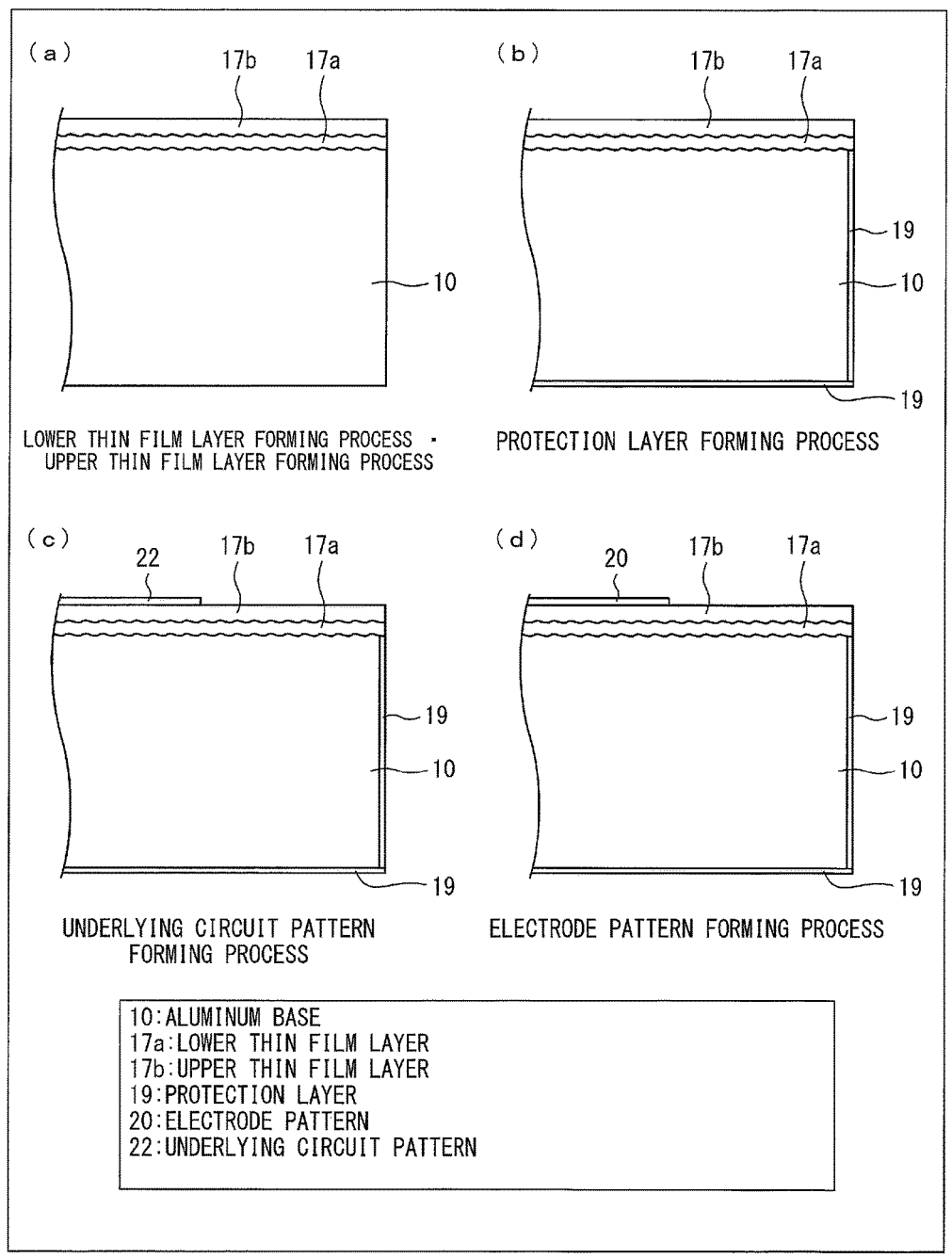
FIGS. 9(a) to 9(d) are views illustrating a manufacturing process of the substrate of the above-described Modification Example 1.

Next, a method for manufacturing the substrate 5A will be described by using FIG. 9. First, as illustrated in FIG. 9(a), the lower thin film layer 17a is formed on the upper surface of the aluminum base 10 (lower thin film layer forming process, thermally conductive layer forming process), and the upper thin film layer is formed thereon (upper thin film layer forming process, reflecting layer forming process). The lower thin film layer 17a and the upper thin film layer 17b may be formed according to the forming method of the thin film layer 17 of Embodiment 1, but the lower thin film layer 17a and the upper thin film layer 17b may be formed by ejecting the ceramic particles to the aluminum base 10 at a high speed, and by forming a deposition layer of a ceramic. Representative examples of such a forming method include a spraying method and an AD method (aerosol deposition method). The spraying method is subdivided by a jetting method of particles, and examples thereof include a plasma ejecting method, a high-speed flame spraying method, and a cold spraying method.

In addition, as the forming method of the thin film layer 17 illustrated in Embodiment 1, the above-described spraying method or the AD method may be used by being appropriately combined with each other. For example, as the lower thin film layer 17a, an alumina layer may be formed by the spraying method, and as the upper thin film layer 17b, a mixed layer of glass and a ceramic may be formed by synthesizing glass by the sol-gel method from a glass raw material after coating the lower thin film layer 17a with the ceramic coating material containing the ceramic particles fired at a high temperature and the glass raw material. In this case, since the lower thin film layer 17a which is formed by using the spraying method is a deposition layer of alumina which does not contain glass as a binder, it is possible to make the lower thin film layer 17a an insulating layer (thermally conductive layer) having a higher heat conductivity than that of the upper thin film layer 17b. In addition, since the forming method of the thin film layer 17 illustrated in Embodiment 1 is used in forming the upper thin film layer 17b, it is possible to easily form the insulating reflecting layer having high reflectivity.

As illustrated in FIG. 9(b), after forming the upper thin film layer 17b, the protective layer 19 is formed on the side surface and the rear surface of the aluminum base 10 (protective layer forming process). In addition, as already described in Embodiment 1, when the glass which is synthesized by the sol-gel method and serves as a binder of the ceramic particles is used, the firing temperature becomes 250° C. to 400° C. Accordingly, in order to avoid generation of a crack (fracture) of the protective layer 19 due to high temperature, it is desirable that the protective layer 19 is formed after forming the lower thin film layer 17a and the upper thin film layer 17b.

In addition, as illustrated in FIG. 9(c), the underlying circuit pattern 22 is formed (underlying circuit pattern forming process, conductive layer forming process), and as illustrated in FIG. 9(d), the electrode metal is deposited on the underlying circuit pattern, and the electrode pattern 20 is formed (electrode pattern forming process).

In addition, the lower thin film layer 17a may be formed by a method other than the above-described method, and may be formed as a ceramic layer which is made of a mixture of a ceramic and glass by coating the aluminum base 10 with a coating material containing ceramic particles and a glass raw material, and by synthesizing the glass by the sol-gel method from the glass raw material. Otherwise, the lower thin film layer 17a may be formed as a ceramic layer made of the mixture of a ceramic and a resin by coating the aluminum base 10 with a coating material containing ceramic particles and a resin, and by hardening. Otherwise, the lower thin film layer 17a may be formed by pasting the ceramic layer which is made of the mixture of a ceramic and a resin and which is processed in a shape of a sheet in advance, to the aluminum base 10.

In addition, the upper thin film layer 17b may be formed as a ceramic layer made of the mixture of a ceramic and a resin by coating the lower thin film layer 17a with the coating material containing ceramic particles and a resin, and by hardening. In this case, for example, when a resin, such as a silicone resin, is used as a binder, since it is possible to easily perform the hardening at a relatively low temperature which is equal to or less than 200° C., it is possible to form the ceramic layer made of the mixture of ceramics and a resin as the upper thin film layer 17b without generation of a crack in the protective layer 19. Accordingly, in this case, it is possible to form the protective layer 19 not only after forming the upper thin film layer 17b, but also before forming the upper thin film layer 17b.

Modification Example 2

In Modification Example 1 described above, a part which corresponds to the electrode pattern 20 may be partially buried in the upper thin film layer 17b. As a specific example, in a case where the electrode pattern is used as a flip chip type substrate for a light emitting device, it is desirable that an electrode pattern 20A is buried in the upper thin film layer 17b in which a large part other than an electrode terminal portion which connects electrodes of the light emitting element is an insulating reflecting layer, and the light reflectivity on the substrate is high. Hereinafter, with reference to FIGS. 10 to 13, as Modification Example 2 of Embodiment 1, a substrate (substrate for a light emitting device) 5B in which a part of the electrode pattern 20A is buried in the upper thin film layer 17b, and a light emitting device 4A which uses the substrate 5B will be described. In addition, configuration elements having the same functions as those of the configuration elements described above will be given the same reference numerals, and the description thereof will not be repeated.

Figure 10:
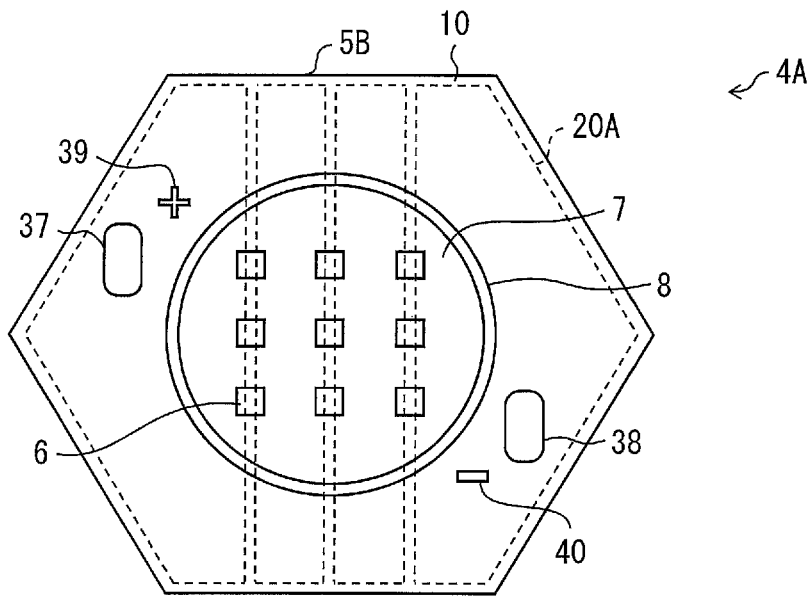
FIG. 10 is a schematic view of a light emitting device of Modification Example 2 of one embodiment of the present invention.

As illustrated in FIG. 10, the light emitting device 4A of Modification Example 2 is the flip chip type light emitting device, and the light emitting element 6 is formed by flip chip bonding on the substrate 5B. The light emitting element 6 is electrically connected to the electrode pattern 20A formed on the substrate 5B. In addition, in the light emitting device 4A, a sealing resin circumferential edge frame body 8 which surrounds the periphery of the light emitting element 6 is provided, and the light emitting element 6 is sealed by filling the inside of the sealing resin circumferential edge frame body 8 with a sealing resin 7. In addition, the shape or the number of each configuration member is not limited to the shape or the number illustrated in the drawings.

Furthermore, the light emitting device 4A includes an anode electrode 37, a cathode electrode 38, an anode mark 39, and a cathode mark 40. The anode electrode 37 and the cathode electrode 38 are electrodes which supply a current for driving the light emitting element 6, and are provided in a landed state. The anode electrode 37 and the cathode electrode 38 are electrodes which can be connected to an external power source which is not illustrated in the light emitting device 4A. The anode electrode 37 and the cathode electrode 38 are connected to the light emitting element 6 via the electrode pattern 20A. The anode mark 39 and the cathode mark 40 are alignment marks which become references for positioning with respect to each of an anode electrode 47 and a cathode electrode 48.

Figure 11:
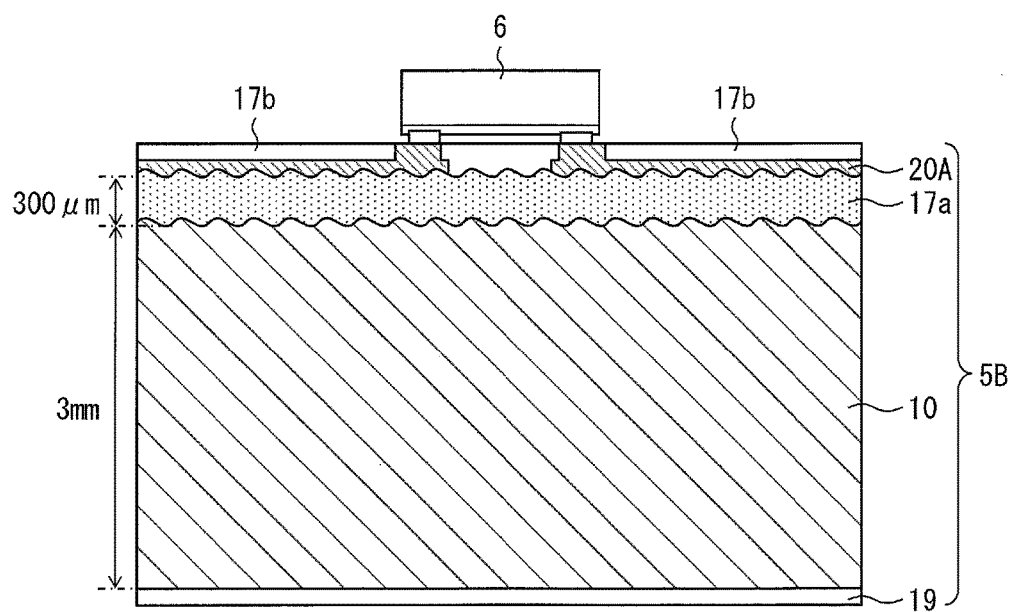
FIG. 11 is a sectional view of a substrate of the light emitting device of the above-described Modification Example 2.

As illustrated in FIG. 11, in the substrate 5B of Modification Example 2, the lower thin film layer 17a, the electrode pattern 20A, and the upper thin film layer 17b are formed in this order on the aluminum base 10, and a part of the electrode pattern 20A is buried in the upper thin film layer 17b. In addition, the protective layer 19 is formed on the rear surface of the aluminum base 10. Although not illustrated in the drawing, the protective layer is also formed on the side surface of the aluminum base 10.

Next, an example of a method for manufacturing the substrate 5B will be described by using FIGS. 12 and 13. As illustrated in FIG. 12(a), first, the lower thin film layer 17a is formed by high-speed flame spraying onto the upper surface of the aluminum base 10 (lower thin film layer forming process by spraying). Next, as illustrated in FIG. 12(b), a part other than the lower thin film layer 17a, that is, an exposed portion of the aluminum base 10, is covered with the protective layer 19 (protective layer forming process). Furthermore, as illustrated in FIG. 12(c), the metal conductive layer is formed by the high-speed flame spraying onto the lower thin film layer 17a (metal conductive layer forming process by spraying), and as illustrated in FIG. 12(d), the metal conductive layer is planarized (planarization process of the metal conductive layer). In addition, as illustrated in FIG. 13(a), a resist 13 is formed at a location which becomes an electrode terminal portion (light emitting element mounting electrode post) on the metal conductive layer (resist forming process), and as illustrated in FIG. 13(b), the metal conductive layer is half-etched (light emitting element mounting electrode post forming process). After this, the resist 13 is removed. Furthermore, as illustrated in FIG. 13(c), the electrode pattern 20A is formed by putting a resist 15 on the metal conductive layer and by etching (electrode pattern forming process), and the resist 15 is removed. In addition, as illustrated in FIG. 13(d), after exposing only the electrode terminal portion of the electrode pattern 20A, the entire electrode pattern 20A is covered with the upper thin film layer 17b (upper thin film layer forming process), and reflectivity is enhanced. The upper thin film layer 17b may be formed similar to Modification Example 1.

Here, in order to electrically connect the light emitting element 6 and the electrode pattern 20A, when using AuSn eutectic solder, it is necessary that the electrode terminal portion of the electrode pattern 20A be covered with Au/Ni or Au/Pd/Ni. For this reason, plating 21 becomes necessary in the electrode terminal portion, but since the aluminum base 10 is already covered with the lower thin film layer 17a and the protective layer 19, the aluminum base 10 is not eroded by the plating solution or the like.

In addition, in Modification Example 2, a configuration in which the electrode pattern 20A is formed on the lower thin film layer 17a, and a part other than the electrode terminal is covered with the upper thin film layer 17b is described, but the invention is not limited thereto. Even when a part of the electrode pattern 20A is covered with the lower thin film layer 17a, on the contrary, the electrode pattern 20A may be covered only with the upper thin film layer 17b without being in contact with the lower thin film layer 17a.

Embodiment 2

In Embodiment 1, the substrate 5 is manufactured in an order of thin film layer forming, protective layer forming, sealing treatment, underlying circuit pattern forming, removing of the resin-coated layer of the underlying circuit pattern, and electrode pattern forming.

On the contrary, in the embodiment, the substrate 5 is manufactured in an order of thin film layer forming, underlying circuit pattern forming, protective layer forming, sealing treatment, and electrode pattern forming. In other words, in the embodiment, a process (treatment order) of a method for manufacturing the substrate 5 is different from that of Embodiment 1. In addition, since the configuration of the substrate 5 is the same, the description thereof will be omitted.

In the manufacturing method of Embodiment 1, before forming the electrode pattern by plating, the resin-coated layer which covers the underlying circuit pattern is removed by etching treatment or the like, and a conductivity is ensured. Here, in the process of forming the protective layer 19, in general, as treatment solution, acidic solution, such as aqueous sulfuric solution, is used. For this reason, by selecting a material which is appropriately dissolved in the acidic solution as a binder for conductive paste, it is possible to simultaneously perform the resin-coated layer removing and the protective layer forming.

Here, in the embodiment, an appropriate combination of the metal paste which forms the underlying circuit pattern and the acidic treatment solution is selected to make a resin-coated layer which is appropriately eroded in the acidic treatment solution used in the protective layer forming. In addition, when performing the underlying circuit pattern forming prior to the protective layer forming, it is possible to perform the removing of the resin-coated layer of the underlying circuit pattern together with the protective layer forming. In this manner, in the embodiment, since it is possible to perform the removal of the resin-coated layer which covers the underlying circuit pattern together with the protective layer forming, it is possible to omit the process (removing of the resin-coated layer of the underlying circuit pattern) in the manufacturing. Accordingly, immediately after forming the protective layer 19, it is possible to move on to the process of forming the electrode pattern 20 by plating.

In addition, in the acidic solution which is used as a treatment solution in the anodic oxidation treatment, there is also a case where an insulating film which covers a conductive layer is not sufficiently removed. In this case, the process of removing the insulating film which covers the conductive layer may be added, or the process may return to a standard order. In other words, after performing the coating film forming process by the anodic oxidation treatment, a conductive layer forming process, a process of removing the insulating film which covers the conductive layer, and an electrode pattern forming process may be performed in order.

Embodiment 3

In the embodiment, one large base from which a plurality of substrates 5 are cut and which is described in Embodiment 1 or 2 is prepared, and the substrate (in which the plurality of substrates 5 are gathered) is diced in the final stage of manufacturing. Since the plurality of substrates 5 can be manufactured at a time, the effect is excellent.

Figure 6:
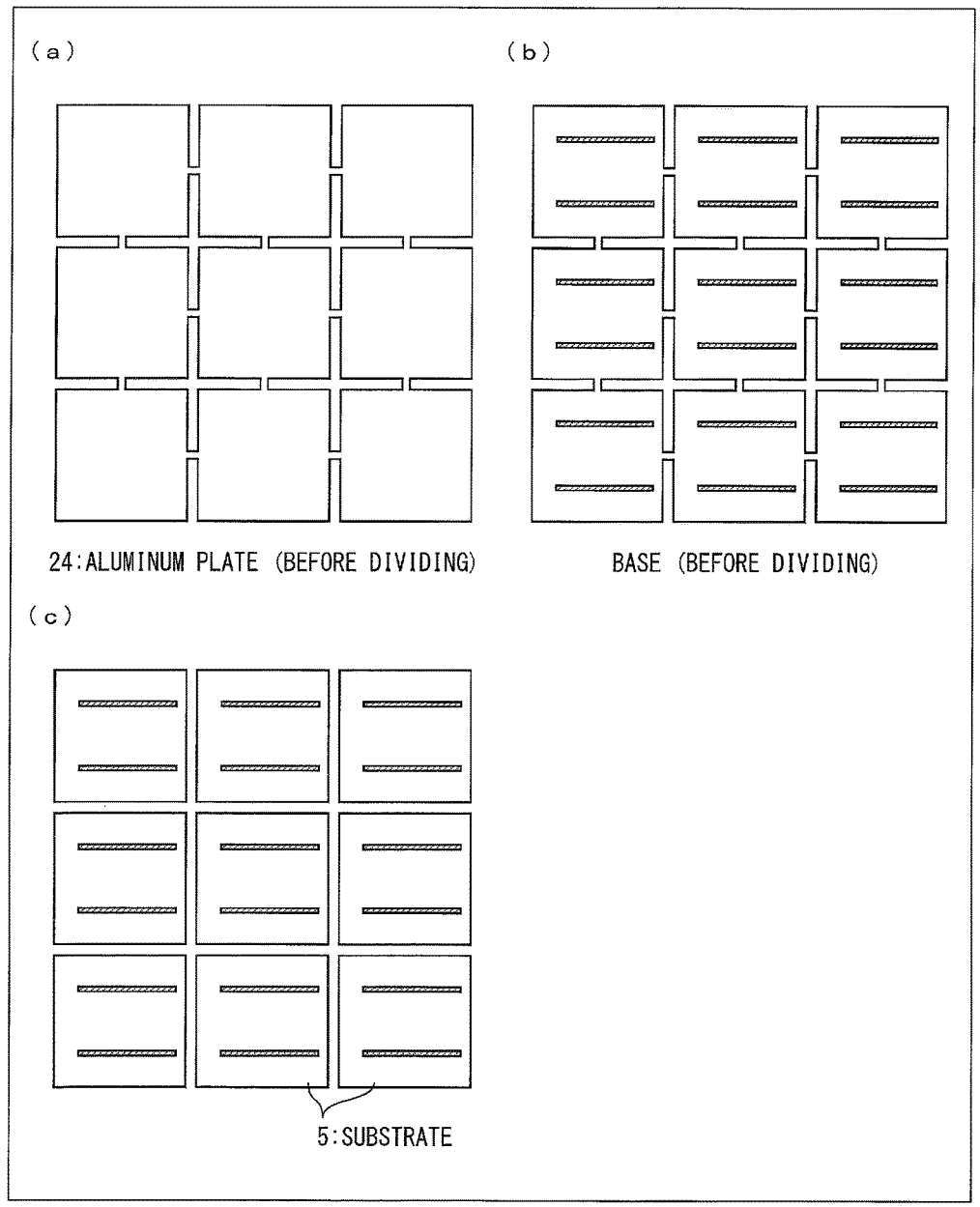
FIGS. 6(a) to 6(c) are views illustrating a manufacturing process of a substrate of another embodiment of the present invention.

First, as illustrated in FIG. 6(a), a notch is made in advance to prepare an aluminum plate (base) 24 and make it easy to cut the aluminum plate 24 when dividing the plate later. In addition, the notch may not be made. In addition, each treatment is performed in the manufacturing process of the substrate 5 illustrated in Embodiment 1 or 2, with respect to the aluminum plate 24. Accordingly, as illustrated in FIG. 6(b), a plurality of structures of the substrates 5 are formed on one aluminum plate 24. Finally, as illustrated in FIG. 6(c), separate substrates 5 are divided and obtained. In addition, in the middle of manufacturing, the aluminum plate 24 is cut, and after the cutting, it is possible to perform the treatment of remaining manufacturing processes.

In addition, the substrates 5 may be diced as illustrated in FIG. 6(c), separate small regions of FIG. 6(a) are finished until becoming the light emitting device, and the regions may be used as light emitting modules which have a plurality of light emitting regions (light emitting devices) maintaining the shape of FIG. 6(b) without cutting the regions.

Embodiment 4

In the embodiment, a light emitting device which is created by using the substrate 5 described in any of Embodiments 1 to 3, will be described. FIGS. 1(a) and 1(b) illustrate a plan view and a front sectional view of a light emitting device 4 of the embodiment. In addition, in the drawings, the number of light emitting elements 6 is substantially omitted and drawn for convenience for simplifying the drawings.

The light emitting device 4 is a chip on board (COB) type light emitting device in which the light emitting elements 6, such as a plurality of LED elements or EL elements, are mounted on the substrate 5 described in any of Embodiments 1 to 3.

The sealing resin circumferential edge frame body 8 which surrounds the periphery of the plurality of light emitting elements 6 is provided on the substrate 5, and the light emitting element 6 is sealed by filling the inside of the sealing resin circumferential edge frame body 8 with the sealing resin 7. A phosphor is included in the sealing resin 7 for converting light to light having different wavelengths by making the phosphor excited by emitted light of the light emitting element 6. In this manner, the light emitting element 6 is surface-emitted by a front surface of the sealing resin 7.

Figure 4:
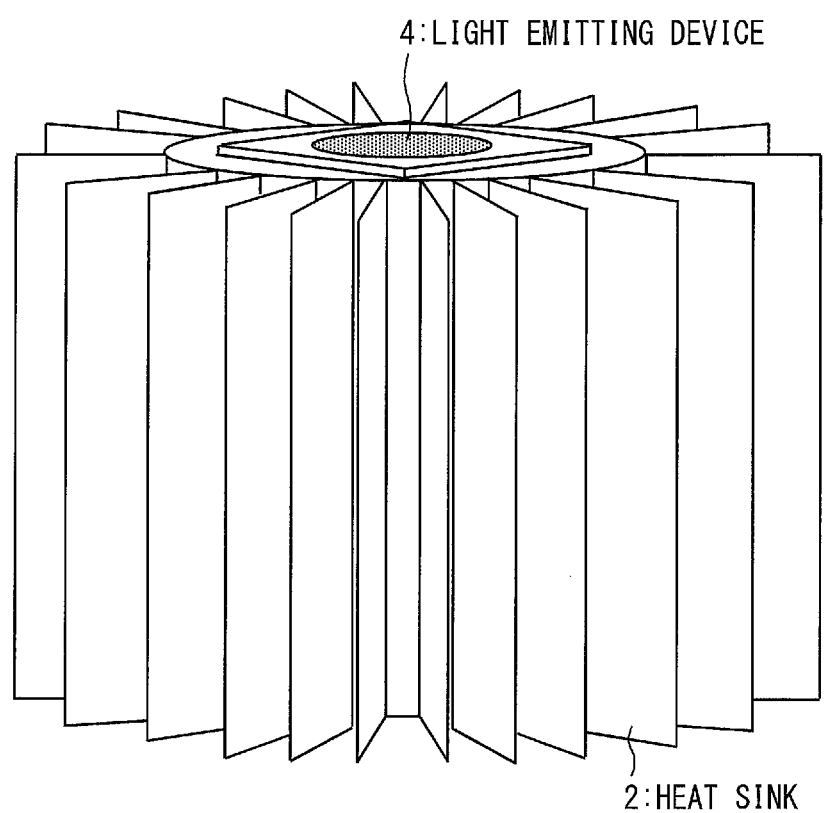
FIG. 4 is a bird's-eye view of the light emitting device mounted in a heat sink.

As supplied power to the light emitting device 4 by integration of the light emitting elements 6, 10 W, 50 W, 100 W, or 100 W or higher are used, and the emitted light having high luminance is obtained. For example, in realizing a high-power light emitting device 4 in which the supplied power is approximately 100 W by integrating medium-sized light emitting elements 6 which are approximately 500 μm×800 μm on the substrate 5, it is necessary to integrate multiple light emitting elements 6, that is, approximately from 300 to 400 light emitting elements 6. Since generated heat of the light emitting device 4 increases by integrating multiple light emitting elements 6, as illustrated in FIG. 4, high heat dissipation may be ensured by a heat sink 2 which has extremely large volume compared to the light emitting device 4.

As the light emitting element 6, for example, a blue LED, a violet LED, and an ultraviolet LED can be used. As a phosphor which fills the sealing resin 7, any one of blue, green, yellow, orange, and red, or an arbitrary combination of a plurality of phosphors, can be used. Accordingly, it is possible to emit the emitted light of a desired color from the light emitting device 4. In addition, the phosphor of the sealing resin 7 may be omitted, the light emitting element 6 having three colors, such as blue, green, and red, which have different light emitting wavelengths, may be arranged on the substrate 5, and a combination of arbitrary two colors or a single color may be employed.

The light emitting device 4 uses the substrate 5 having excellent mass productivity in addition to a function of protecting the base from the plating liquid and an important function as the light emitting device. For this reason, it is possible to manufacture the light emitting device 4 having high luminance suppressing the costs. Accordingly, according to the embodiment, it is possible to provide inexpensive light emitting device having high quality.

Figure 5:
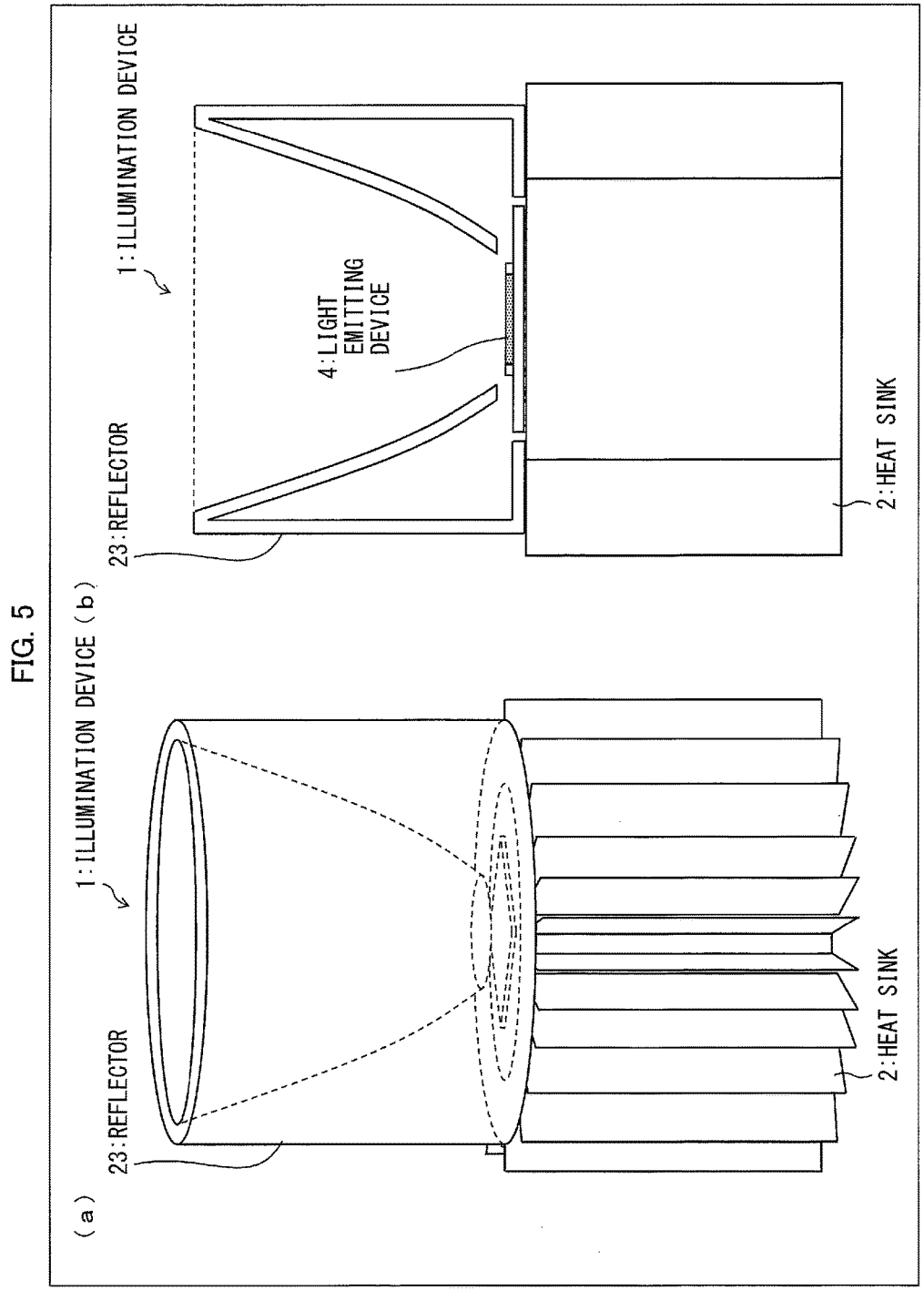
FIG. 5(a) is a bird's-eye view of an illumination device in which the light emitting device of one embodiment of the present invention is employed.
FIG. 5(b) is a sectional view thereof.

In addition, the light emitting device 4 can provide an illumination device 1 having high quality at a low cost to a user since the illumination device 1 which can be employed in the illumination device 1 illustrated in FIG. 5 performs manufacturing by using the inexpensive light emitting device 4 at high quality.

Embodiment 5

In the embodiment, as a modification example of the substrate 5 described in any of Embodiments 1 to 3, a substrate in which the protective layer 19 is formed of the ceramic layer which is the same as the thin film layer 17 will be described. Since another configuration in the substrate is the same, the description thereof will be omitted.

Even in a case where the protective layer 19 is formed of the ceramic layer which is the same as the thin film layer 17, a protecting function which is similar to that described in Embodiments 1 to 3 can be obtained. In a case of the substrate in which the protective layer 19 is made of the same material and the same layer thickness as those of the thin film layer 17, the only difference from the substrate in which the protective layer 19 is formed of alumite is thermal resistance in a vertical direction of the substrate. Hereinafter, thermal resistance will be considered.

A thermal conductivity of alumite is approximately 67 W/(m·K), and a thermal conductivity of glass is approximately 1 W/(m·K). While the thickness of the alumite film which is generally used is approximately 30 μm even in a case where the film is thick, the thickness of the glass layer which functions as the thin film layer 17 is 100 μm. Thermal resistances in the thickness direction of the base in a case where the film having the above-described thicknesses is formed on the rear surface of the aluminum base 10 having a length of 50 mm and a width of 50 mm as the protective layer 19, are respectively 0.00018 K/W and 0.04 K/W. In a case where 100 W of heat is uniformly generated on the entire front surface of the substrate, the temperature in the protective layer 19 increases to 4° C. on the glass layer, while the temperature increases to 0.02° C. in alumite which can be ignored.

For this reason, the protective layer 19 which is an alumite film can further reduce the temperature of an active layer of the light emitting element than the protective layer 19 which is a ceramic layer.

In addition, in the embodiment, as the ceramic layer which is used in the protective layer 19, a case where the same material as that of the thin film layer 17 is used is described, but a composition in which different material from that of the thin film layer 17 is used may be employed. As a mixed layer of a ceramic and glass, a layer formed only of glass may be employed without practically inputting a ceramic. In other words, the protective layer 19 may be formed of any material if the material functions as both a protective layer of the light emitting device 4, and a protective layer in the manufacturing process of the substrate. It is needless to say that the thicknesses of the protective layer 19 and the thin film layer 17 may be different from each other.

SUMMARY

The substrate for a light emitting device (substrate 5) according to a first aspect of the present invention is a substrate for a light emitting device in which the insulating reflecting layer (thin film layer 17) which reflects the light from the light emitting element is formed on the base formed of aluminum (aluminum base 10), in which the surface of the base other than the surface on which the reflecting layer is formed is covered with the aluminum anodic oxide film (protective layer 19).

According to the above-described configuration, since the surface of the base made of aluminum other than the surface on which the reflecting layer is formed is covered with the aluminum anodic oxide film (alumite), it is possible to protect the base by the coating film.

Alumite is a stable insulating material having excellent chemical resistance and relatively high thermal conductivity. By performing the anodic oxidation treatment in the acidic solution, a large amount of alumite can be easily obtained at a low cost. For this reason, alumite may be formed by the anodic oxidation treatment of the base made of aluminum. In addition, in many cases, the thickness thereof is from several μm to several tens of μm.

Alumite is not deposited by plating since alumite is an insulating material having high chemical resistance without erosion by the plating solution which is used when forming the electrode pattern on the substrate. For this reason, when performing the plating treatment, alumite functions as a protection film. In addition, even when the alumite is provided on a surface (surface opposite to the light emitting element mounting surface) which comes into contact with the heat sink of the base, since thermal conductivity is relatively high and the thickness is thin only to be several tens of μm, an influence as a thermal resistance component may be extremely small.

Furthermore, since alumite is a stable material, even in an environment that alumite is used in the air where the general high power light emitting device is used, alumite is thermally stable. In this manner, since alumite is a thermally stable material and has low thermal resistance, even when alumite remains on the base after finishing to perform a role as a protection film from the plating solution, basic functions which are required for the substrate for a light emitting device, such as high heat dissipation or long-term reliability, are not damaged. In contrast, due to stability of alumite as a material, by covering the front surface of the base with alumite, it is possible to prevent oxidation from proceeding, and to play a role of enhancing long-term reliability.

In this manner, alumite can be used for both functions of a protection film (protection film in the process) in the manufacturing process and a protection film (protection film for the device) after the manufacturing. Since alumite is used as the protection film for the process at the same time when alumite is used for improving long-term reliability of the substrate by using alumite as the protection film for the device, it is possible to simplify the manufacturing process, and to improve yield.

In the configuration of the substrate for a light emitting device according to the first aspect of the present invention, since the base is protected by alumite, it is possible to solve problems of production. In other words, complications of work are eliminated in attaching and detaching the insulating protection sheet having chemical resistance which is used for preventing erosion of the base due to the plating solution and deposition of plating. In the anodic oxidation treatment (alumite treatment) of forming alumite which is used for the above-described purposes, unlike a case where the protection sheet is attached to the base one by one, it is possible to form alumite by collectively applying multiple bases to chemical liquid. For this reason, mass productivity is excellent. Deterioration of yield due to an attachment defect of the protection sheet also does not occur. At a location where the chemical liquid infiltrates, even in a case of a hole at which it is difficult to cover the surface with the protection sheet, it is possible to cover the front surface of the base with alumite, and extremely efficient work can be performed. In addition, unlike a case of the protection sheet, since it is also not necessary to remove alumite formed on the base after forming the electrode pattern by plating, using alumite is more economical.

As described above, according to the above-described configuration, it is possible to provide a substrate for a light emitting device which has a function of protecting the base, and is excellent in mass productivity without deterioration of functions required as the light emitting device.

In the substrate for a light emitting device according to a second aspect of the present invention, according to the substrate for a light emitting device of the first aspect, the insulating thermally conductive layer (lower thin film layer 17a) having a higher thermal conductivity than the reflecting layer may be interposed between the base and the reflecting layer (upper thin film layer 17b).

According to the above-described configuration, since the insulating thermally conductive layer having a higher thermal conductivity than the reflecting layer is interposed between the reflecting layer and the base, it is possible to realize a high-reflection substrate which has an excellent thermal conductivity and excellent electric insulating properties.

In the substrate for a light emitting device according to a third aspect of the present invention, according to the substrate for a light emitting device of the first or the second aspect, the reflecting layer may be made of the mixture of a ceramic and glass, the mixture of a ceramic and a resin, or a ceramic.

According to the above-described configuration, since the reflecting layer is made of the mixture of a ceramic and glass, the mixture of a ceramic and a resin, or a ceramic, even when the base is made of a material which has a low melting point (660° C.), such as aluminum, it is possible to form the reflecting layer having high reflectivity on the front surface thereof.

In the substrate for a light emitting device according to a fourth aspect of the present invention, according to the substrate for a light emitting device of the first or the second aspect, the reflecting layer may be a sintered body of a ceramic and glass.

According to the above-described configuration, since the reflecting layer is a sintered body of a ceramic and glass, even when the base is made of a material which has a low melting point, such as aluminum, it is possible to solidly form the reflecting layer having high reflectivity on the front surface thereof.

In a light emitting device according to a fifth aspect of the present invention, according to the substrate for a light emitting device of any one of the first to the third aspects, the electrode pattern which is electrically connected to the electrode of the light emitting element may be formed on the reflecting layer.

According to the above-described configuration, it is possible to electrically connect the light emitting elements by the electrode pattern on the reflecting layer.

In the light emitting device according to a sixth aspect of the present invention, according to the substrate for a light emitting device of any one of the first to the third aspects, the electrode pattern which is electrically connected to the electrode of the light emitting element may be buried in the reflecting layer, and the terminal portion of the electrode pattern may be exposed on the front surface of the reflecting layer.

According to the above-described configuration, it is possible to electrically connect to the light emitting elements by the electrode pattern. In addition, it is possible to protect the electrode pattern other than the terminal portion by burying the electrode pattern in the reflecting layer.

In the light emitting device according to a seventh aspect of the present invention, according to the substrate for a light emitting device of the second aspect, the electrode pattern which is electrically connected to the electrode of the light emitting element may be buried in the reflecting layer, and may be in contact with an upper part of the thermally conductive layer or may be buried in the thermally conductive layer, and the terminal portion of the electrode pattern may be exposed on the front surface of the reflecting layer.

According to the above-described configuration, it is possible to be electrically connected to the light emitting elements by the electrode pattern. In addition, it is possible to bury and protect the electrode pattern other than the terminal portion in the reflecting layer or on the reflecting layer, and in the thermally conductive layer.

In the light emitting device according to an eighth aspect of the present invention, according to the substrate for a light emitting device of any one of the fifth aspect to the seventh aspect, the light emitting elements are provided on the substrate for a light emitting device.

According to the above-described configuration, since the substrate for a light emitting device which has both a function of protecting the base from the plating solution and an important function as the light emitting device, and is excellent in mass productivity is used, it is possible to manufacture a light emitting device having high luminance at a low cost. Accordingly, it is possible to provide the light emitting device having high quality at a low cost.

In the light emitting device according to a ninth aspect of the present invention, according to the light emitting device of the eighth aspect, the sealing resin which covers the light emitting element may be provided.

According to the above-described configuration, by covering the light emitting element with the sealing resin, it is possible to protect a wire electrode or the like.

In the light emitting device according to a tenth aspect of the present invention, according to the light emitting device of the ninth aspect, the sealing resin may contain a phosphor.

According to the above-described configuration, by mixing the phosphor to the sealing resin, it is possible to realize a light source having a desired color.

A method for manufacturing the substrate for a light emitting device according to an eleventh aspect of the present invention includes: a reflecting layer forming process of forming an insulating reflecting layer on a base made of aluminum; a coating film forming process of forming an aluminum anodic oxide film by performing the anodic oxidation treatment with respect to a surface of the base other than a surface on which the reflecting layer is formed; a conductive layer forming process of forming the conductive layer on the reflecting layer; and an electrode pattern forming process of forming the electrode pattern by plating on the conductive layer. According to the above-described method, since the aluminum anodic oxide film (alumite) is formed by performing the anodic oxidation treatment with respect to the surface of the base made of aluminum other than the surface on which the reflecting layer is formed, it is possible to easily manufacture the substrate for a light emitting device which has a function of protecting the base, and is excellent in mass productivity without deterioration of functions required as the light emitting device.

In the method for manufacturing the substrate for a light emitting device according to a twelfth aspect of the present invention, according to the method for manufacturing the substrate for a light emitting device of the eleventh aspect, in the reflecting layer forming process, a ceramic layer made of a mixture of a ceramic and glass may be formed as the reflecting layer by coating the base with a coating material containing ceramic particles and a glass raw material, and by synthesizing glass by a sol-gel method from the glass raw material.

According to the above-described method, since it is possible to form the ceramic layer at a relatively low temperature, even when the metal having a low melting point which is 660° C., such as aluminum, is the base, it is possible to manufacture the substrate for a light emitting device.

In the method for manufacturing the substrate for a light emitting device according to a thirteenth aspect of the present invention, according to the method for manufacturing the substrate for a light emitting device of the eleventh aspect, the reflecting layer forming process may include a sintering process of sintering the ceramic layer at 250° C. to 400° C.

According to the above-described method, in the sintering process, by synthesizing glass by the sol-gel method from the glass raw material in range of 250° C. to 400° C., it is possible to form a stable reflecting layer on the base.

In the method for manufacturing the substrate for a light emitting device according to a fourteenth aspect of the present invention, according to the method for manufacturing the substrate for a light emitting device of any one of the eleventh to the thirteenth aspects, the coating film forming process may be performed after the reflecting layer forming process.

In the reflecting layer forming process, even in a case where the ceramic layer made of the mixture of a ceramic and glass is formed by synthesizing glass by the sol-gel method from the glass raw material, it is necessary that the sintering temperature is at least 250° C. to 400° C. Here, when alumite is formed before the ceramic layer is formed, there is a case where a crack is generated in alumite in the sintering process at 250° C. to 400° C. in forming the ceramic layer. In this manner, in a state where the crack is generated in alumite, in the plating process of forming the electrode pattern, the function of protecting the base made of aluminum from the plating solution substantially deteriorates.

Therefore, according to the above-described method, by performing the coating film forming process after the reflecting layer forming process, there is not a case where alumite is exposed to a high temperature when forming the reflecting layer, and it is possible to prevent a crack from being generated in alumite.

In the method for manufacturing the substrate for a light emitting device according to a fifteenth aspect of the present invention, according to the method for manufacturing the substrate for a light emitting device of any one of the eleventh to the fourteenth aspects, the coating film forming process may be performed between the conductive layer forming process and the electrode pattern forming process.

According to the above-described method, by performing the coating film forming process between the conductive layer forming process and the electrode pattern forming process, it is possible to omit a process in forming the substrate. This will be described in detail.

In the conductive layer forming process, in general, by using conductive paste containing a conductive metal, such as silver (Ag), after coating the front surface of the substrate by printing or the like, the substrate is dried and hardened. The front surface of the conductive layer after the hardening is generally covered with the insulating coating film, such as a resin used as a binder of the paste. For this reason, before forming the electrode pattern by plating, it is necessary to remove the insulating coating film which covers the conductive layer by etching treatment or the like, and to ensure conductivity.

However, when substituting the process of removing the insulating coating film which covers the conductive layer that becomes an underlayer of the electrode pattern, for the anodic oxidation treatment of the coating film forming process, it is possible to omit one process. In the process of forming the aluminum anodic oxide film, in general, the acidic solution, such as aqueous sulfuric solution, is used as the treatment solution. For this reason, by selecting a material which is appropriately dissolved in the acidic solution as a binder for conductive paste, it is possible to simultaneously perform the insulating film removing process and the anodic oxidation treatment. Accordingly, immediately after the coating film forming process in which the anodic oxidation treatment is performed, it is possible to move on to the process of forming the electrode pattern by plating.

In addition, in the acidic solution which is used as the treatment solution in the anodic oxidation treatment, there is also a case where the insulating film which covers the conductive layer is not sufficiently removed. In this case, the process of removing the insulating film which covers the conductive layer may be added, or the process may return to a standard order. In other words, after performing the coating film forming process by the anodic oxidation treatment, the conductive layer forming process, the process of removing the insulating film which covers the conductive layer, and the electrode pattern forming process may be performed in order.

A method for manufacturing the substrate for a light emitting device according to a sixteenth aspect of the present invention, includes a thermally conductive layer forming process of forming an insulating thermally conductive layer on a base made of aluminum; a reflecting layer forming process of forming an insulating reflecting layer on the thermally conductive layer; a coating film forming process of forming an aluminum anodic oxide film on a surface of the base other than a surface on which the thermally conductive layer is formed; a conductive layer forming process of forming a conductive layer on the reflecting layer or in the reflecting layer; and an electrode pattern forming process of forming an electrode pattern on the conductive layer. In the reflecting layer forming process, a ceramic layer made of a mixture of a ceramic and glass is formed as the reflecting layer by coating a layer which becomes a lower layer of the reflecting layer with a coating material containing ceramic particles and a glass raw material, and by synthesizing glass by a sol-gel method from the glass raw material, a ceramic layer made of a mixture of a ceramic and a resin is formed as the reflecting layer by coating the surface which becomes the lower layer of the reflecting layer with a coating material containing ceramic particles and a resin, and by hardening, or a deposition layer of a ceramic is formed as the reflecting layer by ejecting the ceramic particles onto the layer which becomes the lower layer of the reflecting layer at a high speed.

According to the above-described method, since the aluminum anodic oxide film (alumite) is formed by performing the anodic oxidation treatment with respect to the surface of the base made of aluminum other than the surface on which the reflecting layer is formed, it is possible to easily manufacture the substrate for a light emitting device which has a function of protecting the base, and is excellent in mass productivity without deterioration of functions required as the light emitting device. In addition, since it is possible to form the reflecting layer at a relatively low temperature, even when the metal having a low melting point which is 660° C., such as aluminum, is the base, it is possible to manufacture the substrate for a light emitting device.

In the method for manufacturing the substrate for a light emitting device according to a seventeenth aspect of the present invention, according to the method for manufacturing the substrate for a light emitting device of the sixteenth aspect, the coating film forming process may be performed after the thermally conductive layer forming process.

According to the above-described method, by performing the coating film forming process after the thermally conductive layer forming process, there is not a case where alumite is exposed to a high temperature when forming the thermally conductive layer, and it is possible to prevent a crack from being generated in alumite.

In the method for manufacturing the substrate for a light emitting device according to an eighteenth aspect of the present invention, according to the method for manufacturing the substrate for a light emitting device of the seventeenth aspect, in a case where the ceramic layer made of the mixture of a ceramic and a resin is used as the reflecting layer, the coating film forming process may be performed before the reflecting layer forming process.

In a case where the ceramic layer made of the mixture of a ceramic and a resin is used as the reflecting layer, when a resin, such as a silicone resin, is used as a binder, it is possible to easily harden and form the layer at a relatively low temperature which is equal to or less than 200° C. Accordingly, without generation of a crack on the aluminum anodic oxide film, it is possible to form the ceramic layer made of the mixture of a ceramic and a resin. For this reason, the coating film forming process can be performed not only after the reflecting layer forming process, but also before the reflecting layer forming process.

However, in a case where the ceramic layer made of the mixture of a ceramic and glass is used as the reflecting layer, glass is fired at a high temperature which is equal to or higher than 250° C. in the reflecting layer forming process. For this reason, when performing the coating film forming process before the reflecting layer forming process, a crack is generated on the aluminum anodic oxide film. For this reason, it is preferable to perform the coating film forming process after the reflecting layer forming process.

In the method for manufacturing the substrate for a light emitting device according to a nineteenth aspect of the present invention, according to the method for manufacturing the substrate for a light emitting device of any one of the sixteenth to the eighteenth aspects, in the thermally conductive layer forming process, a deposition layer of a ceramic may be formed as the thermally conductive layer by ejecting the ceramic particles onto the base, a ceramic layer made of the mixture of a ceramic and glass may be formed as the thermally conductive layer by coating the base with the coating material containing ceramic particles and a glass raw material, and by synthesizing glass by the sol-gel method from the glass raw material, or a ceramic layer made of the mixture of a ceramic and a resin may be formed as the thermally conductive layer.

According to the above-described method, since it is possible to form the thermally conductive layer at a relatively low temperature, even when the metal having a low melting point which is 660° C., such as aluminum, is the base, it is possible to manufacture the substrate for a light emitting device. In addition, in a case where the ceramic layer made of the mixture of a ceramic and a resin is formed as the thermally conductive layer, the ceramic layer made of the mixture of a ceramic and a resin may be formed by coating the base with the coating material containing ceramic particles and a resin, and by hardening, or the ceramic layer made of the mixture of a ceramic and a resin which is processed in a shape of a sheet in advance may be pasted to the base.

In the method for manufacturing the substrate for a light emitting device according to a twentieth aspect of the present invention, according to the method for manufacturing the substrate for a light emitting device of any one of the eleventh to the nineteenth aspects, a sealing process of sealing a hole of the aluminum anodic oxide film may be included.

According to the above-described method, by performing the sealing treatment with respect to the aluminum anodic oxide film, the anodic oxide film is further stabilized. Accordingly, since it is possible to prevent oxidation from proceeding, it is possible to further improve long-term reliability of the substrate for a light emitting device.

The present invention is not limited to each embodiment and each modification example described above, can be changed in various manners, and an embodiment which is obtained by appropriately combining technical means disclosed in each of different embodiments is also included in the technical range of the present invention. Furthermore, by combining the technical means disclosed in each of the embodiments, it is possible to form new technical characteristics.

INDUSTRIAL APPLICABILITY

A substrate for a light emitting device according to the present invention can be used as a substrate of various types of light emitting devices. In particular, the light emitting device according to the present invention can be used as a high-luminance LED light emitting device. According to a manufacturing method of the present invention, it is possible to protect the substrate for a light emitting device and manufacture the substrate by a method which is excellent in mass productivity.

REFERENCE SIGNS LIST

1 ILLUMINATION DEVICE
2 HEAT SINK
4, 4A LIGHT EMITTING DEVICE
5, 5A, 5B SUBSTRATE (SUBSTRATE FOR A LIGHT EMITTING DEVICE)
6 LIGHT EMITTING ELEMENT
7 SEALING RESIN
8 SEALING RESIN CIRCUMFERENTIAL EDGE FRAME BODY
10 ALUMINUM BASE (BASE)
17 THIN FILM LAYER (REFLECTING LAYER)
17a LOWER THIN FILM LAYER (THERMALLY CONDUCTIVE LAYER)
17b UPPER THIN FILM LAYER (REFLECTING LAYER)
19 PROTECTIVE LAYER (ALUMINUM ANODIC OXIDE FILM)
20, 20A ELECTRODE PATTERN
22 UNDERLYING CIRCUIT PATTERN

The invention claimed is:

1. A substrate for a light emitting device in which an insulating reflecting layer that reflects light from a light emitting element is provided on a front surface of a base including aluminum, wherein
 a rear surface of the base is covered with an aluminum anodic oxide film,
 an electrode pattern which is electrically connected to an electrode of the light emitting element is provided under the reflecting layer,
 a terminal portion of the electrode pattern is exposed on a front surface of the reflecting layer,
 a side surface of the base is covered with the aluminum anodic oxide film, the aluminum anodic film is made of anodic oxide-treated material, and
 the reflecting layer is a thin film layer which substantially covers an entirety of the electrode pattern except for the terminal portion.

2. The substrate for a light emitting device according to claim 1, wherein the reflecting layer includes one of a mixture of a ceramic and glass, a mixture of a ceramic and a resin, and a ceramic.

3. A light emitting device, comprising:
 a light emitting element on the substrate for a light emitting device according to claim 2.

4. A light emitting device, comprising:
 a light emitting element on the substrate for a light emitting device according to claim 1.

5. The light emitting device according to claim 4, wherein an upper surface of the reflecting layer is lower in position than an upper surface of the light emitting element.

6. The light emitting device according to claim 4, wherein the reflecting layer is provided immediately below the light emitting element.

7. The substrate for a light emitting device according to claim 1, wherein a portion of the electrode pattern that is immediately below the terminal portion is thicker than another portion of the electrode pattern that is immediately below the reflecting layer.

8. A substrate for a light emitting device in which an insulating reflecting layer that reflects light from a light emitting element is provided on a front surface of a base including aluminum, wherein
 a rear surface of the base is covered with an aluminum anodic oxide film,
 an insulating thermally conductive layer having a higher thermal conductivity than that of the reflecting layer is between the base and the reflecting layer,
 an electrode pattern which is electrically connected to an electrode of the light emitting element is provided under the reflecting layer, and is in contact with an upper portion of the thermally conductive layer or is provided under the thermally conductive layer,
 a terminal portion of the electrode pattern is exposed on a front surface of the reflecting layer,
 a side surface of the base is covered with the aluminum anodic oxide film,
 the aluminum anodic film is made of anodic oxide-treated material, and
 the reflecting layer is a thin film layer which substantially covers an entirety of the electrode pattern except for the terminal portion.

9. The substrate for a light emitting device according to claim 8, wherein the reflecting layer is made of a mixture of a ceramic and glass, a mixture of a ceramic and a resin, or a ceramic.

10. A light emitting device, comprising:
 a light emitting element on the substrate for a light emitting device according to claim 8.

11. The light emitting device according to claim 1, wherein an upper surface of the reflecting layer is lower in position than an upper surface of the light emitting element.

12. The light emitting device according to claim 10, wherein the reflecting layer is provided immediately below the light emitting element.

13. The substrate for a light emitting device according to claim 8, wherein a portion of the electrode pattern that is immediately below the terminal portion is thicker than another portion of the electrode pattern that is immediately below the reflecting layer.

* * * * *